(12) United States Patent
Ma et al.

(10) Patent No.: US 11,934,109 B2
(45) Date of Patent: Mar. 19, 2024

(54) OVERLAY ALIGNMENT MARK AND METHOD FOR MEASURING OVERLAY ERROR

(71) Applicant: Zhongke Jingyuan Electron Limited, Beijing (CN), Beijing (CN)

(72) Inventors: Weimin Ma, Beijing (CN); Chunying Han, Beijing (CN); Chengcheng Liu, Beijing (CN); Shouyan Huang, Being (CN)

(73) Assignee: Zhongke Jingyuan Electron Limited, Beijing (CN), Beijing (CN)

( * ) Notice: Subject to any disclaimer, the term of this patent is extended or adjusted under 35 U.S.C. 154(b) by 400 days.

(21) Appl. No.: 17/315,619

(22) Filed: May 10, 2021

(65) Prior Publication Data
US 2021/0382402 A1    Dec. 9, 2021

(30) Foreign Application Priority Data

Jun. 3, 2020   (CN) .......................... 202010494717.1

(51) Int. Cl.
| | | |
|---|---|---|
| *G03F 7/20* | (2006.01) | |
| *G03F 7/00* | (2006.01) | |
| *G03F 9/00* | (2006.01) | |
| *H01L 23/544* | (2006.01) | |

(52) U.S. Cl.
CPC ........ *G03F 9/7076* (2013.01); *G03F 7/70633* (2013.01); *H01L 23/544* (2013.01); *H01L 2223/54426* (2013.01)

(58) Field of Classification Search
CPC ..... G03F 7/70; G03F 7/20; G03F 9/70; G03F 9/00; H01L 23/544
USPC ............................................. 250/559.4, 221
See application file for complete search history.

(56) References Cited

U.S. PATENT DOCUMENTS

2021/0382401 A1*  12/2021  Liu .................... G03F 7/70683

* cited by examiner

*Primary Examiner* — Que Tan Le
(74) *Attorney, Agent, or Firm* — Fish & Richardson P.C.

(57) ABSTRACT

An overlay alignment mark located in a patterned wafer and a method for measuring overlay error are provided, the patterned wafer having a lower-layer pattern in a first layer thereof and an upper-layer pattern in a second layer thereof above the first layer, the overlay alignment mark comprising: a first pattern, which is a portion of the lower-layer pattern and comprises a pair of solid features formed in the first layer; and a second pattern, which is a portion of the upper-layer pattern and comprises two pairs of hollowed features formed in the second layer, with two imaginary lines connecting between geometric centers of respective pairs in the two pairs of hollowed features extending in two mutually orthogonal directions, respectively; an orthographic projection of the pair of solid features on the wafer at least partially overlaps with an orthographic projection of a respective pair of hollowed features on the wafer.

13 Claims, 8 Drawing Sheets

ND METHOD FOR MEASURING OVERLAY ERROR

OVERLAY ALIGNMENT MARK AND METHOD FOR MEASURING OVERLAY ERROR

CROSS-REFERENCE TO RELATED APPLICATION

The present disclosure claims the benefit of Chinese Patent Application No. 202010494717.1 filed on Jun. 3, 2020 in the National Intellectual Property Administration of China, the whole disclosure of which is incorporated herein by reference.

TECHNICAL FIELD

Embodiments of the present disclosure relates to the field of semiconductor manufacturing and detection, and more specifically to an overlay alignment mark (especially for SEM imaging) and a method for measuring overlay error.

BACKGROUND

In manufacturing technology of semiconductor devices, mask patterns on a mask or a reticle are typically transferred onto a photoresist layer on a surface of a wafer, by lithography processes. And the lithography processes typically comprises following steps: photoresist coating, masking, exposure, development, and the like. With the continuous improvement of the integration degree of semiconductor devices, feature sizes of devices are decreasing continuously, and the processes become more and more complex. In order to achieve superior device performance, there exist strict requirements on feature sizes of lithography patterns in various layers. In order to reduce sizes of semiconductor devices, typically, in addition to increasing layout density of devices by reducing linewidth of devices, the integration degree of devices is further improved by increasing specific number of layers processed by lithography, for example. Therefore, in multi-layer lithography processes, alignment between and/or among various process layers is one of the basic requirements of the production processes, then, it is necessary to measure and to correct overlay error between layers in order to achieve required overlay accuracy and ensure accurate and precise overlay alignment between layers. The overlay error represents positional offset of respective patterns in various layers, and the overlay accuracy is usually assessed by the overlay error between two layers or among three layers. The overlay accuracy not only depends on the positioning accuracy and processing accuracy of a machine table/stage, but also depends on the perfection in control applied by a control system.

The importance of overlay accuracy for both lithography process and yield is self-evident; therefore, the detection of overlay error and the control on overlay accuracy are particularly important. A common feature in relevant art is to determine the overlay error by measuring specialized/dedicated overlay measurement mark which is designed in advance. However, in practical applications, especially in specific occasions (such as the development of devices or in the later error checking process), specialized/dedicated overlay measurement mark may be missing, which may result in failure of method for measuring overlay error in the relevant art.

The embodiment of the present disclosure more specifically relates to the measurement of CDSEM, that is, measurement of critical dimensions (CDs) of patterns by using a SEM apparatus. CD values as measured by the SEM apparatus may for example comprise sizes of photoresist pattern formed after exposure and development thereof. Only when the SEM measurement results meet requirements, subsequent processes such as ion implantation or etching or the like can be carried out. As for the measurement of CDSEM, it is usually required to carry out an alignment by means of an optical microscope above all, then, based on the alignment with SEM, the measurement of CD value is implemented with SEM. In order to implement the alignment using SEM, it is necessary to set the overlay alignment mark for SEM, especially to use the existing specific geometric pattern(s) of patterned wafer as the overlay alignment mark.

SUMMARY

Embodiments of the present disclosure have been made to overcome or alleviate at least one aspect of the above mentioned defects and/or deficiencies in the relevant art, by providing an overlay alignment mark and a method for measuring overlay error.

Following technical solution are provided in exemplary embodiments of the disclosure:

According to an aspect of the embodiments of the disclosure, there is provided an overlay alignment mark located in a patterned wafer, the patterned wafer having a lower-layer pattern in a first layer thereof and an upper-layer pattern in a second layer thereof above the first layer, the overlay alignment mark comprising: a first pattern, which is a portion of the lower-layer pattern and comprises a pair of solid features formed in the first layer; and a second pattern, which is a portion of the upper-layer pattern and comprises two pairs of hollowed features formed in the second layer, with two imaginary lines connecting between geometric centers of respective pairs in the two pairs of hollowed features extending in two mutually orthogonal directions, respectively; an orthographic projection of the pair of solid features on the wafer at least partially overlaps with an orthographic projection of a respective pair of hollowed features on the wafer.

According to exemplary embodiments of the present disclosure, the pair of solid features are designed to be in the form of two solid patterns having strip-shaped sections in the first layer respectively, both of which not only have central symmetry, to each other, about a first reference point located therebetween in the first layer, but also have mirror symmetry to each other with respect to the first reference point; the two pairs of hollowed feature are designed to be in the form of two pairs of through-holes having rectangular sections in the second layer respectively, with the two imaginary lines connecting between geometric centers of respective pairs in the two pairs of through-holes extending in the two mutually orthogonal directions respectively; the pair of solid features are at least partially observable through one pair of through-holes, which functions as the respective pair of hollowed features and have its respective imaginary line connecting between geometric centers thereof extending in a first direction of the two mutually orthogonal directions, and the other pair of through-holes not only have central symmetry about a second reference point in the second layer but also have mirror symmetry to each other with respect to the second reference point; respective two opposite side edges of the strip-shaped sections of the pair of solid features extend in a second direction, perpendicular to the first direction, of the two mutually orthogonal directions and are at least partially exposed from the respective pair of hollowed features.

According to exemplary embodiments of the present disclosure, the upper-layer pattern of the wafer comprises a plurality of through-holes arranged in an array, and the two pairs of hollowed features comprise: a first pair of through-holes arranged in one of both a row direction and a column direction of the array, and a second pair of through-holes arranged in the other of both the row direction and the column direction of the array, in the plurality of through-holes; and respective two opposite side edges of the strip-shaped sections of the pair of solid features extending in one of the row direction and the column direction are at least partially exposed from a respective pair of the first pair of through-holes and the second pair of through-holes.

According to exemplary embodiments of the present disclosure, a coordinate value of the first reference point in the first direction and a coordinate value of the second reference point in the first direction are set such that a difference between these two coordinate values is a first constant.

According to exemplary embodiments of the present disclosure, the first constant is zero.

According to exemplary embodiments of the present disclosure, an overlay error between different layers of the wafer is an overlay error between the first layer and the second layer, at least comprising: a deviation between the first layer and the second layer in the first direction, which is defined by subtracting the first constant from a deviation between the first pattern and the second pattern in the first direction.

According to exemplary embodiments of the present disclosure, the deviation between the first pattern and the second pattern in the first direction is defined as a difference between the coordinate value of the first reference point in the first direction and the coordinate value of the second reference point in the first direction.

According to exemplary embodiments of the present disclosure, the coordinate value of the first reference point in the first direction is defined as a half of a sum of mean values of coordinate values of respective two opposite side edges of the pair of solid features in the first direction.

According to exemplary embodiments of the present disclosure, the deviation between the first pattern and the second pattern in the first direction is defined as ½ of a difference between distances between respective centerlines of the pair of solid features parallel to the second direction and the second reference point.

According to exemplary embodiments of the present disclosure, a distance between respective centerline of each solid feature of the pair of solid features parallel to the second direction and the second reference point, is defined as: an absolute value of a difference between a mean value of the coordinate values of respective two opposite side edges of each solid feature extending in the second direction, in the first direction and the coordinate value of the second reference point in the first direction.

According to exemplary embodiments of the present disclosure, the other pair of hollowed features which are different from the respective pair of hollowed features, are designed such that a mean value between coordinate values of respective geometric centers thereof in the first direction is the same as the coordinate value of the second reference point in the first direction.

According to exemplary embodiments of the present disclosure, the other pair of hollowed features which are different from the respective pair of hollowed features, are designed such that the coordinate values of respective geometric centers thereof in the first direction are the same as each other.

According to exemplary embodiments of the present disclosure, the coordinate value of the second reference point in the first direction is defined as a mean value of coordinate values, in the first direction, of geometric centers of circle patterns or ellipse patterns obtained by fitting from the other pair of hollowed features.

According to an aspect of the embodiments of the disclosure, there is provided a method for measuring overlay error, comprising: providing an overlay alignment mark in a patterned wafer having both a lower-layer pattern in a first layer thereof and an upper-layer pattern in a second layer thereof above the first layer, and measuring an overlay error between different layers of the wafer by measuring a deviation between portions of the overlay alignment mark which portions are located in the different layers of the wafer. And providing an overlay alignment mark comprises: selecting a portion of the lower-layer pattern, which portion comprises a pair of solid features formed in the first layer, as a first pattern; and selecting a portion of the upper-layer pattern, which portion comprises two pairs of hollowed features formed in the second layer with two imaginary lines connecting between geometric centers of respective pairs in the two pairs of hollowed features extending in two mutually orthogonal directions respectively, as a second pattern, wherein an orthographic projection of the pair of solid features on the wafer at least partially overlaps with an orthographic projection of a respective pair of hollowed features on the wafer.

According to exemplary embodiments of the present disclosure, selecting a portion of the lower-layer pattern as a first pattern comprises: selecting two solid patterns having strip-shaped sections in the first layer respectively as the pair of solid features, both of which not only have central symmetry, to each other, about a first reference point located therebetween in the first layer, but also have mirror symmetry to each other with respect to the first reference point; and selecting a portion of the upper-layer pattern as a second pattern comprises: selecting two pairs of through-holes having rectangular sections in the second layer respectively as the two pairs of hollowed features, with the two imaginary lines connecting between geometric centers of respective pairs in the two pairs of through-holes extending in the two mutually orthogonal directions respectively, wherein the pair of solid features are at least partially observable through one pair of through-holes, which functions as the respective pair of hollowed features and have its respective imaginary line connecting between geometric centers thereof extending in a first direction of the two mutually orthogonal directions, and the other pair of through-holes not only have central symmetry about a second reference point in the second layer but also have mirror symmetry to each other with respect to the second reference point; respective two opposite side edges of the strip-shaped sections of the pair of solid features extend in a second direction, perpendicular to the first direction, of the two mutually orthogonal directions and are at least partially exposed from the respective pair of hollowed features.

According to exemplary embodiments of the present disclosure, the upper-layer pattern of the wafer comprises a plurality of through-holes arranged in an array, and then selecting two pairs of through-holes in the second layer respectively as the two pairs of hollowed features comprises: selecting a first pair of through-holes arranged in one of both a row direction and a column direction of the array, and a second pair of through-holes arranged in the other of both the row direction and the column direction of the array, in the plurality of through-holes, wherein respective two opposite side edges of the strip-shaped sections of the pair of solid features extending in one of the row direction and the column direction are at least partially exposed from a respective pair of the first pair of through-holes and the second pair of through-holes.

According to exemplary embodiments of the present disclosure, a coordinate value of the first reference point in the first direction and a coordinate value of the second reference point in the first direction are set such that a difference between these two coordinate values is a first constant.

According to exemplary embodiments of the present disclosure, the first constant is preset to be zero.

According to exemplary embodiments of the present disclosure, measuring an overlay error between different layers of the wafer by measuring a deviation between portions of the overlay alignment mark which portions are located in the different layers of the wafer at least comprises: obtaining a deviation between the first layer and the second layer in the first direction, by subtracting the first constant from measurement of a deviation between the first pattern and the second pattern in the first direction.

According to exemplary embodiments of the present disclosure, measurement of a deviation between the first pattern and the second pattern in the first direction comprises: measuring a difference between the coordinate value of the first reference point in the first direction and the coordinate value of the second reference point in the first direction.

According to exemplary embodiments of the present disclosure, the coordinate value of the first reference point in the first direction is obtained by measuring a half of a sum of mean values of coordinate values of respective two opposite side edges of the pair of solid features in the first direction.

According to exemplary embodiments of the present disclosure, measurement of a deviation between the first pattern and the second pattern in the first direction comprises: measuring ½ of a difference between distances between respective centerlines of the pair of solid features parallel to the second direction and the second reference point.

According to exemplary embodiments of the present disclosure, a distance between respective centerline of each solid feature of the pair of solid features parallel to the second direction and the second reference point is obtained, by measuring an absolute value of a difference between a mean value of the coordinate values of respective two opposite side edges of each solid feature extending in the second direction, in the first direction and the coordinate value of the second reference point in the first direction.

According to exemplary embodiments of the present disclosure, the other pair of hollowed features which are different from the respective pair of hollowed features, are designed such that a mean value between coordinate values of respective geometric centers thereof in the first direction is the same as the coordinate value of the second reference point in the first direction.

According to exemplary embodiments of the present disclosure, the other pair of hollowed features which are different from the respective pair of hollowed features, are designed such that the coordinate values of respective geometric centers thereof in the first direction are the same as each other.

According to exemplary embodiments of the present disclosure, the coordinate value of the second reference point in the first direction is obtained, by fitting the other pair of hollowed features into circle patterns or ellipse patterns and then solving a mean value of coordinate values, in the first direction, of geometric centers of the circle patterns or the ellipse patterns.

BRIEF DESCRIPTION OF THE DRAWINGS

Embodiments of the disclosure are depicted merely by way of example, by referring to accompanying schematic drawings at present, wherein corresponding reference numerals in the drawings represent corresponding components. The drawings are briefly depicted as follows.

DETAILED DESCRIPTION OF EMBODIMENTS

Figure 1A:
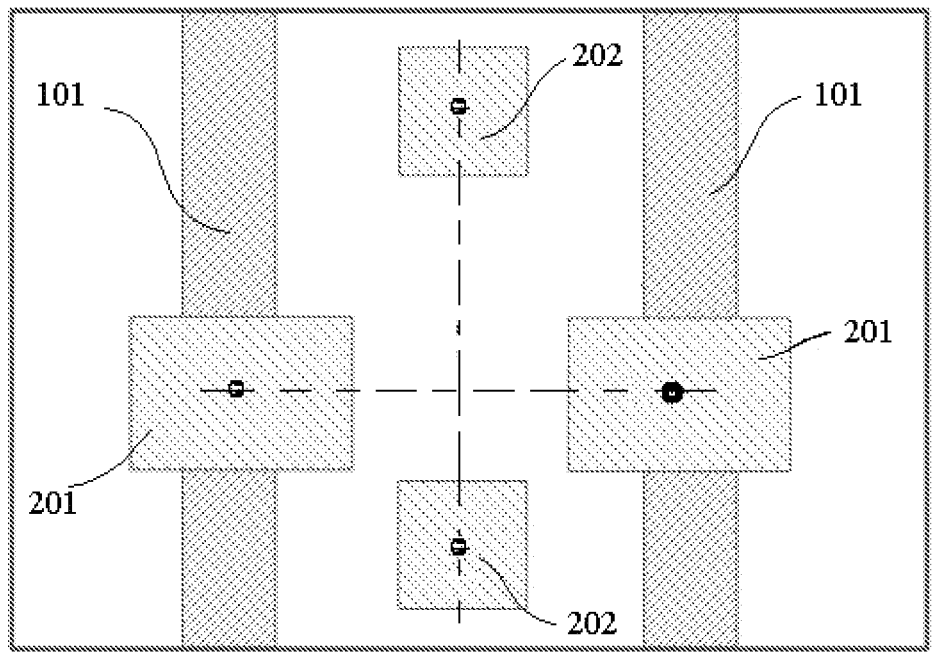
FIG. 1(a) shows in a top view a layout of an exemplary arrangement of overlay alignment mark as part of a patterned wafer pattern according to an embodiment of the present disclosure.

The technical scheme of the present disclosure will be further explained in detail in combination with the accompanying drawings. In the specification, the same or similar reference numerals and letters indicate the same or similar parts. The following description of embodiments of the present disclosure with reference to the accompanying drawings is intended to explain the general inventive concept of the present disclosure and should not be construed as a limitation of the present disclosure.

The drawings are used to illustrate the contents of the present disclosure. Respective dimension and shape of each component in the drawings are only intended to exemplarily illustrate the contents of the disclosure, rather than to demonstrate the practical dimension or proportion of components used in various layers of the semiconductor devices and overlay alignment mark according to embodiments of the present disclosure.

In relevant art, during the implementation of multilayer lithography processes, the overlay error is usually obtained by measuring an overlay alignment mark for multilayer in two-dimensional directions (direction x and direction y) of a plane parallel to the substrate of the wafer, respectively. Moreover, in the relevant art, the implementation of CDSEM measurement for multi-layer lithography processes usually requires a coarse alignment by using an optical microscope above all, and then a fine alignment by using a SEM apparatus, and then the SEM apparatus is used to measure CD values. In order to realize the alignment with SEM, it is required to set the overlay alignment mark of the SEM apparatus reasonably.

As to the setup of overlay alignment mark in relevant art, two factors as follows should be taken into account, i.e., firstly, a set of fixed overlay alignment mark should be used to measure the overlay error in two orthogonal directions (e.g., direction x and direction y) at the same time; secondly, the overlay accuracy between multiple layers should be measured by measuring the overlay error between multiple layers (at least two layers). However, more specifically, when using SEM images to measure multilayer overlay accuracy in relevant art, for example, the overlay errors may be typically determined by measuring pre-designed and preset dedicated/specialized overlay measurement mark(s). However, in practical applications, especially in specific occasions (such as the development of devices or in the later error checking process), special overlay measurement mark may be missing, which may result in failure of method for measuring overlay errors in the relevant art.

Therefore, there is an urgent need for an improved overlay alignment mark in the art, which may be utilized, during acquisition of SEM images for measuring the overlay error, for specific wafer patterns, with the geometric shape of the patterns of the wafer itself and using tools provided by software; then measurement points are selected and calculation formulas are set by an operator; and a sampling operation is in turn carried out and images are acquired by CD-SEM apparatus depending on a preset recipe, and a result of the overlay error is calculated and reported subsequently. Thereby, with the geometric pattern of a chip itself, rather than a dedicated/specialized overlay alignment mark which is specially provided, the measurement of the overlay error is performed.

Basic Concept

Figure 1B:
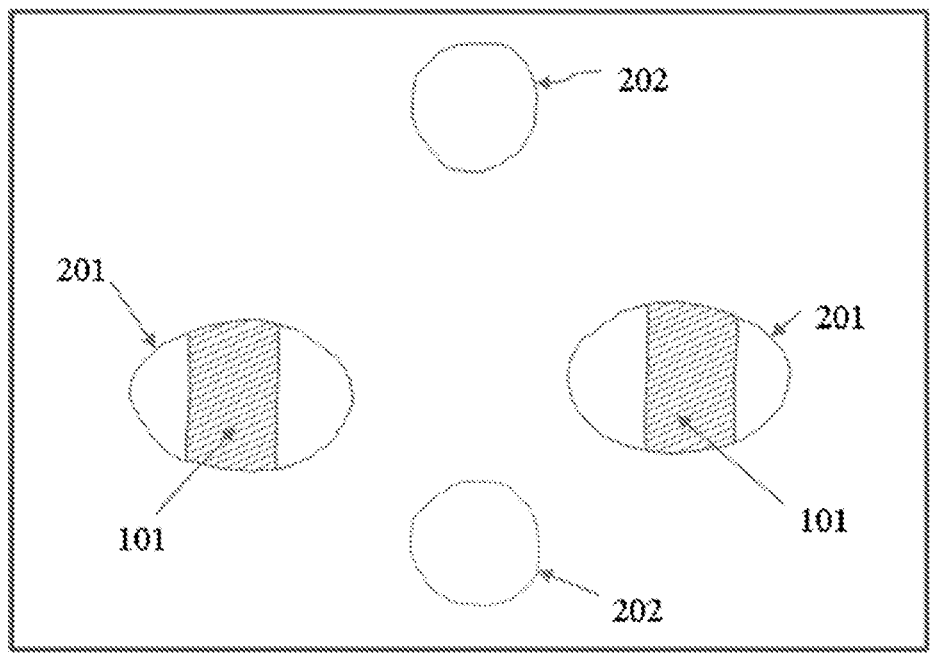
FIG. 1(b) shows in a top view a pattern formed after actual processing of overlay alignment mark as part of a patterned wafer pattern as shown in FIG. 1(a)

FIG. 1(a) shows in a top view a layout of an exemplary arrangement of overlay alignment mark as part of a patterned wafer pattern according to an embodiment of the present disclosure; FIG. 1(b) shows in a top view a pattern formed after actual processing of overlay alignment mark as part of a patterned wafer pattern as shown in FIG. 1(a).

According to a general technical concept of embodiments of the disclosure, as illustrated in FIG. 1(a) and FIG. 1(b), in one aspect of embodiments of the disclosure, an overlay alignment mark located in a patterned wafer is provided, the wafer is for example to be imaged by scanning thereover by SEM, and the patterned wafer has a lower-layer pattern in a first layer thereof and an upper-layer pattern in a second layer thereof above the first layer, the overlay alignment mark comprises: a first pattern, which is a portion of the lower-layer pattern and comprises a pair of solid features 101 formed in the first layer; and a second pattern, which is a portion of the upper-layer pattern and comprises two pairs of hollowed features 201, 202 formed in the second layer, with an imaginary line connecting between geometric centers of one pair 201 of the two pairs of hollowed features and another imaginary line connecting between geometric centers of the other pair 202 of the two pairs of hollowed features extending in two mutually orthogonal directions (i.e., two directions which are orthogonal to each other, respectively); in other words, with two imaginary lines connecting between geometric centers of respective pairs in the two pairs of hollowed features 201, 202 extending in two mutually orthogonal directions, respectively. Furthermore, an orthographic projection of the pair of solid features 101 on the wafer at least partially overlaps with an orthographic projection of a respective pair of hollowed features of the two pairs of hollowed features 201, 202 on the wafer.

Figure 2A:
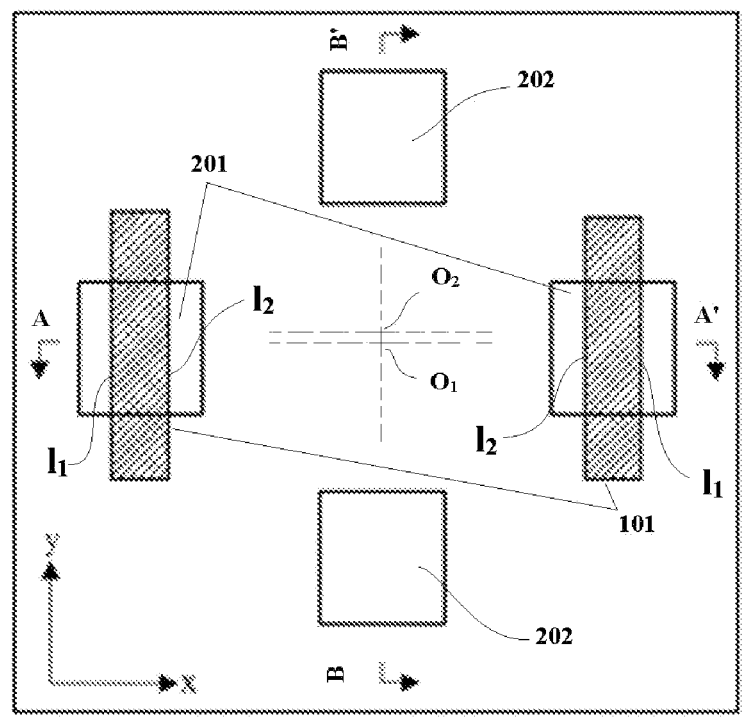
FIG. 2(a) shows in a top view a schematic layout of the overlay alignment mark as shown in FIG. 1(a)

Moreover, FIG. 2(a) shows in a top view a schematic layout of the overlay alignment mark as shown in FIG. 1(a).

In a further embodiment of the present disclosure, for example, as shown in the figures, the pair of solid features 101 are designed to be in the form of two solid patterns having strip-shaped sections in the first layer respectively, both of which not only have central symmetry, to each other, about a first reference point $O_1$ located therebetween in the first layer, but also have mirror symmetry to each other with respect to the first reference point $O_1$; the two pairs of hollowed features 201, 202 are designed to be in the form of two pairs of through-holes having rectangular sections in the second layer respectively, with the two imaginary lines connecting between geometric centers of respective pairs in the two pairs of through-holes extending in the two mutually orthogonal directions respectively (more specifically, an imaginary line connecting between geometric centers of a first pair of through-holes 201 and another imaginary line connecting between geometric centers of a second pair of through-holes 202 extend in two directions orthogonal to each other, respectively). The pair of solid features are at least partially observable through one pair of through-holes, which functions as the respective pair of hollowed features and have its respective imaginary line connecting between geometric centers thereof extending in a first direction (e.g., a horizontal direction labeled by 'x' of a reference rectangular coordinate system as illustrated in the lower left corner of FIG. 2(a)) of the two mutually orthogonal directions; and the other pair of through-holes not only have central symmetry about a second reference point $O_2$ in the second layer but also have mirror symmetry with respect to the second reference point $O_2$. And respective two opposite side edges of the strip-shaped sections of the pair of solid features extend in a second direction (e.g., a vertical direction labeled by 'y' of the reference rectangular coordinate system as illustrated in the lower left corner of FIG. 2(a)), perpendicular to the first direction, of the two mutually orthogonal directions and are at least partially exposed from the respective pair of hollowed features.

Figure 3A:
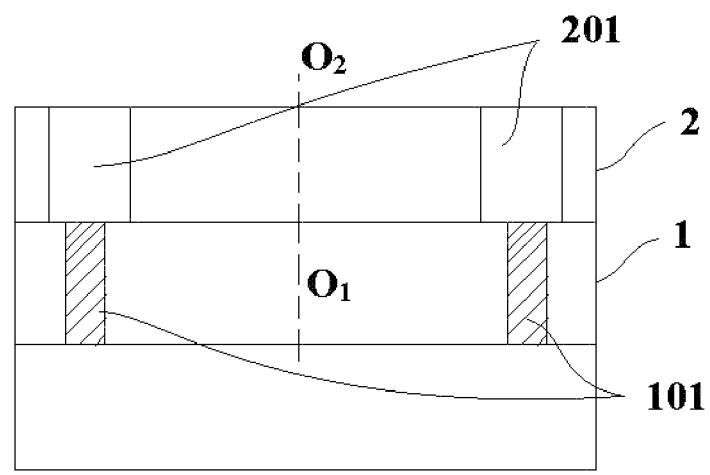
FIG. 3(a) and FIG. 3(b) show sectional views cut along section lines A-A' and B-B' in FIG. 2(a), respectively.
Figure 3B:
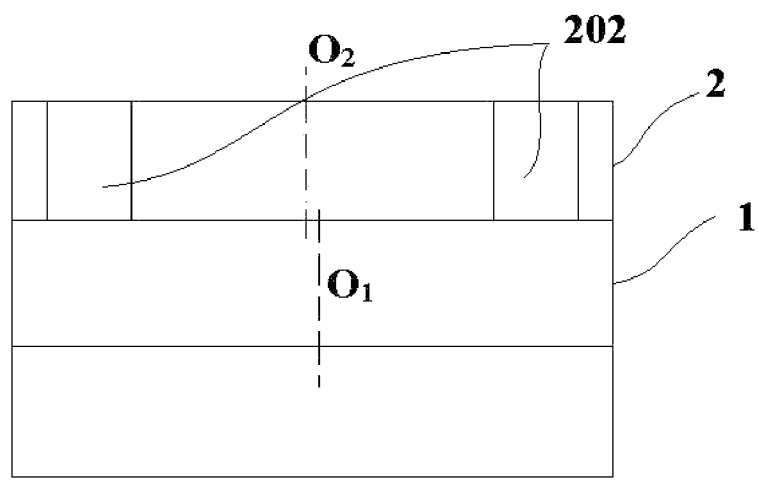
Figure 4A:
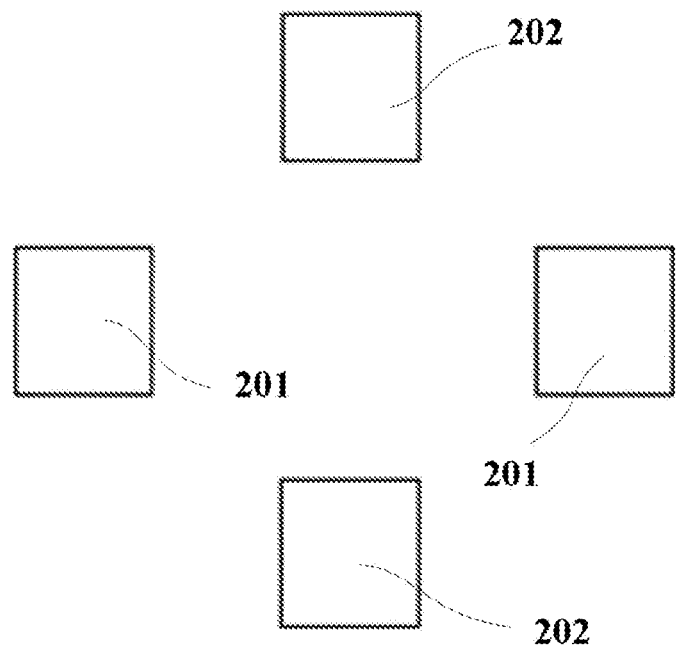
FIG. 4(a) and FIG. 4(b) show, in top views, portions of the overlay alignment mark as illustrated in FIG. 2(a) which are located respectively in the second layer as a current layer and in the first layer as a previous layer.
Figure 4B:
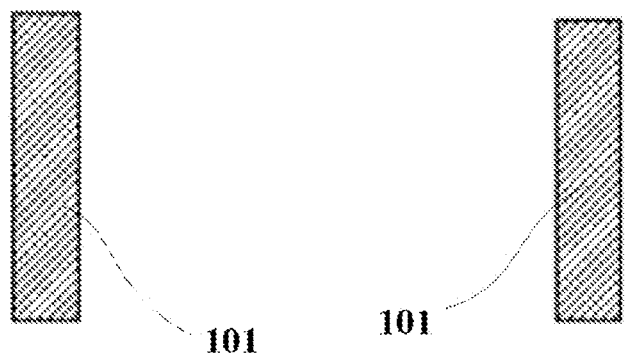

FIG. 3(a) and FIG. 3(b) show sectional views cut along section lines A-A' and B-B' in FIG. 2(a), respectively; FIG. 4(a) and FIG. 4(b) show, in top views, portions of the overlay alignment mark as illustrated in FIG. 2(a) which are located respectively in the second layer as a current layer and in the first layer as a previous layer.

More specifically, by way of example, a specific layered arrangement of the overlay alignment mark shown in FIG. 2(a) is schematically illustrated in FIG. 3(a) and FIG. 3(b), where the overlay alignment mark comprises a first pattern 10 which is located in the first layer 1 of the wafer; and a second pattern 20, which is located in the second layer 2 above the first layer 1 of the wafer. The first pattern 10 comprises two first solid features 101 provided opposite to each other in the first direction (e.g., the horizontal direction x) and extending in the second direction (e.g., the vertical direction y) perpendicular to the first direction respectively. And the second pattern 20 comprises: two first hollowed features 201 provided opposite to each other in the first direction x; and two second hollowed features 202 provided opposite to each other in the second direction y. Furthermore, two opposite side edges of each of the two first solid features 101 extending in the second direction y are at least partially exposed from a respective one of the two first hollowed features 201 (i.e., a respective first hollowed feature); in other words, an orthographic projection of the two first solid features 101 on the wafer at least partially overlaps with an orthographic projection of the two first hollowed features 201 on the wafer, and an orthographic projection of the two opposite side edges of each of the two first solid features 101 extending in the second direction y on the wafer falls within a scope of an orthographic projection of the respective first hollowed feature 201 on the wafer.

FIG. 4(a) and FIG. 4(b) show, in top views, portions of the overlay alignment mark as illustrated in FIG. 2(a) which are located respectively in the second layer as a current layer and in the first layer as a previous layer. Then, corresponding to the conditions as illustrated in FIG. 3(a) to FIG. 3(b), FIG. 4(a) shows in a top view a plane layout of the second pattern 20, which is located in the second layer 2 of the wafer, in the overlay alignment mark, and FIG. 4(b) shows also in a top view a plane layout of the first pattern 10, which is located in the first layer 1 of the wafer, in the overlay alignment mark. As such, for example, based on a combination of the specific layered arrangement of the overlay alignment mark as shown in the sectional views of FIG. 3(a) and FIG. 3(b) and the plane layouts of the portions of the overlay alignment mark which are located in various layer as shown in the top views of FIG. 4(a) and FIG. 4(b), then, in the first pattern 10 located in the first layer 1 below the second layer 2, the first solid features 101 are at least partially observable through the respective first hollowed features 201 from above. Furthermore, while performing a single-pass (i.e., single-shot) SEM imaging on the second pattern of the second layer 2, the first pattern 10 (specifically, the two first solid features) in the first layer 1 which is at least partially observable through the two first hollowed features 201 of the second pattern can also be imaged. As such, in the single-pass SEM image as obtained, respective portions thereof which are imaged from the two first hollowed features 201, the two second hollowed features 202, and the two first solid features 101 respectively are for example referred to as "first hollowed sub-images", "second hollowed sub-images" and "first solid sub-images", respectively. Then, in the single-pass SEM image, side edges of a respective solid sub-image (e.g., outer side edge $I_1$ and inner side edge $I_2$, both of which extend in the second direction y as illustrated in FIG. 2(a)) as imaged from side edges of each first solid feature 101, are at least partially exposed from and are thus observable through a respective first hollowed sub-image as imaged from a respective first hollowed feature 201 which overlaps with said first solid feature 101.

For convenience, the second layer 2 only formed with hollowed features therein is also referred to as the current layer; and the first layer 1 located below the second layer 2 is also referred to as the previous layer.

Figure 1C:
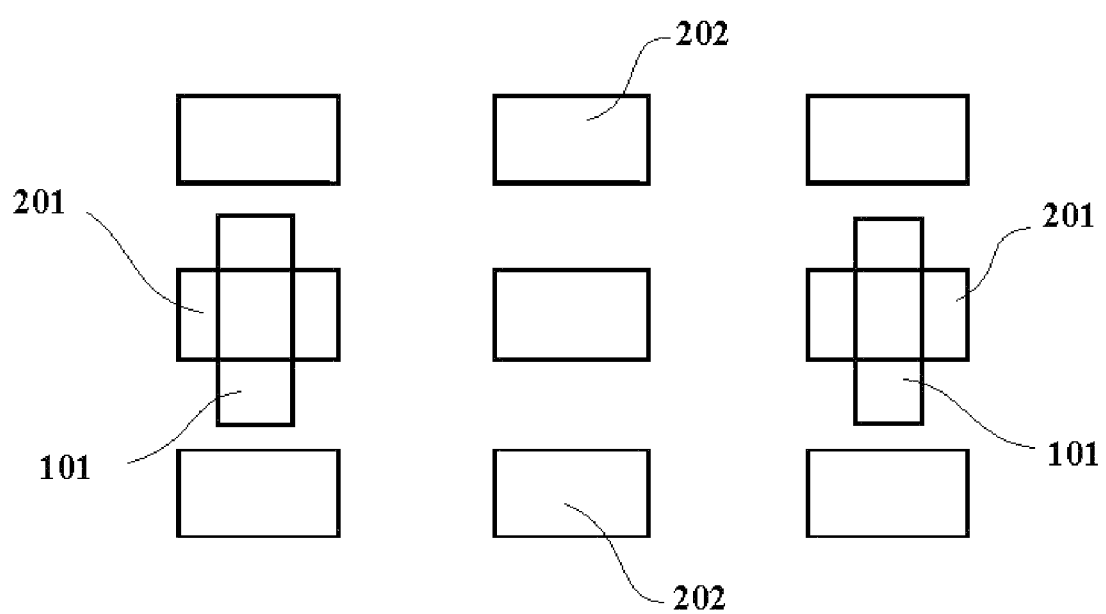
FIG. 1(c) schematically shows in a top view a design layout of an overlay alignment mark as a portion of a patterned wafer pattern according to an extended embodiment of the present disclosure.

FIG. 1(c) schematically shows in a top view a design layout of an overlay alignment mark as a portion of a patterned wafer pattern according to an extended embodiment of the present disclosure.

In a further extended embodiment, for example, as shown in FIG. 1(c), assuming that in the second layer (i.e., the current layer) of the wafer, the upper-layer pattern of the wafer comprises a plurality of through-holes arranged in an array, then, the two pairs of hollowed features comprise the first pair of through-holes 201 and the second pair of through-holes 202, the second pair of through-holes 202 are arranged in one (e.g., the column direction as illustrated) of both a row direction and a column direction of the array, and the first pair of through-holes 201 are arranged in the other (e.g., the row direction as illustrated) of both a row direction and a column direction of the array, in the plurality of through-holes. And respective two opposite side edges of the strip-shaped sections of the pair of solid features extending in one (e.g., the column direction as illustrated) of the row direction and the column direction are at least partially exposed from a respective pair of the first pair of through-holes and the second pair of through-holes (as illustrated, at least partially exposed from the first pair of through-holes 201). That is to say, in the first layer 1 of the wafer (i.e., the previous layer), solid features 101 are formed, which have strip-shaped sections and are at least partially observable through the respective pair of hollowed features (e.g., the first pair of through-holes 201 as illustrated); and the two mutually orthogonal directions may function as the first direction x and the second direction y as described above, respectively, e.g., the row direction and the column direction here.

Therefore, for the patterned wafer whose various layers are formed with respective specific patterns, a portion of the pattern features of existing patterns in both the current layer and the previous layer can be utilized to function as the overlay alignment mark, without additionally forming any dedicated/special overlay alignment mark. Thus, during both preparation and application of devices, a problem of failure of overlay error measurement in the relevant art, which is potentially brought about due to lack of dedicated/special overlay alignment mark additionally provided is in turn avoided.

Basic Embodiment of Overlay Alignment Mark

In exemplary embodiments, the first pattern 10 is formed in the first layer 1, such as the two first solid features 101; the second pattern 20 is formed in the second layer 2, such as the two first hollowed features 201 and the two second hollowed features 202, as shown in the sectional views of FIG. 3(a) and FIG. 3(b). The first layer 1 is for example a silicon substrate, a conductive layer or an insulating layer; and the second layer 2 is for example a conductive layer or an insulating layer. Moreover, the two first solid features 101 are for example designed as solid patterns having strip-shaped sections, such as a column-shaped structure, a truncated cone-shaped structure or the like which is formed in the first layer 1 or projects from a surface of another material layer below the first layer 1; and the two first hollowed features 201 and the two second hollowed features 202 are for example groove structures recessed into the second layer 2.

By the settings on the basis of the aforementioned general technical concept, that is, the first solid features 101 in the first layer 1 and the first hollowed features 201 in the second layer 2 at least partially overlap with each other, such that respective two side edges of each of the two first solid features 101 which are opposite to each other in the first direction x and extend in the second direction y, are at least partially exposed from a respective one of the two first hollowed features 201, then, substantially, the first solid features 201 in the first layer functioning as the previous layer are observable from above, at least partially through the first hollowed features 201 in the second layer functioning as the current layer; that is to say, while performing a SEM imaging on the second layer 2, the two first solid features 101 in the first layer 1 which are at least partially exposed through the two first hollowed features 201 in the second layer 2 can also be imaged. As such, in contrast to a solution in the relevant art where respective portions of an overlay alignment mark located respectively in various layers of the wafer are arranged such that their respective orthographic projections on the wafer are staggered with respect to each other (i.e. they fail to overlap with each other at all) and thus it is necessary to acquire SEM patterns layer by layer, then, in the solution of embodiments of the present disclosure, the first solid features 101 in the previous layer at least partially overlap with the first hollowed features 201 in the current layer and thus are observable through the latter from above, then, portions of the overlay alignment mark located in different layers (i.e. the first pattern 10 and the second pattern 20) can be obtained simultaneously merely by acquiring once a single-pass SEM image of both the previous layer and the current layer which overlap at least partially with each other, so as to avoid moving the SEM apparatus for many times during a layer-by-layer acquisition of SEM images by scanning thereby and an interference thus caused on measurement of the overlay error as applied by a displacement of the SEM apparatus relative to specific locations of the wafer to be scanned by electron beam emitted from the SEM apparatus, then it is not necessary to adjust energy of the electron beam of the SEM apparatus for many times; and the overlay error between different layers of the wafer, e.g., the overlay error between the current layer and the previous layer (and more specifically, for example, a component of the overlay error for example in the first direction x), can be calculated based on the single-pass SEM image by acquiring the SEM image only once, simplifying steps of measuring the overlay error.

In an exemplary embodiment, as shown in FIG. 2(a), for example, each first solid feature 101 is designed to be in the form of a solid pattern having a strip-shaped section, and the two first solid features 101 are designed such that they not only have central symmetry, to each other, about the first reference point $O_1$, but also have mirror symmetry to each other with respect to the first reference point $O_1$ (that is, the first reference point $O_1$ functions as a reference about which the two first solid features 101 have central symmetry; and since the two first solid features 101 are provided opposite to each other in the first direction x and extend in the second direction y respectively, then an axis which is parallel to the second direction y and passes through the first reference point $O_1$ functions as an axis with respect to which the two first solid features 101 have mirror symmetry, i.e., for short, the first reference point $O_1$ also functions as a reference of mirror symmetry of the two first solid features 101). Therefore, the first reference point $O_1$ is hereinafter referred to as a symmetrical center of the two first solid features 101. And, by way of example, the first hollowed features 201 and the second hollowed features 202 are each designed to be in the form of through-hole having rectangular section, and one type of the two first hollowed features 201 and the two second hollowed features 202 (for example, the two second hollowed features 202 as shown in the figure which do not overlap with the two first solid features 101 at all, i.e., the other pair of hollowed features being different from said respective pair of hollowed features) are designed to have central symmetry about the second reference point $O_2$, but also have mirror symmetry with respect to the second reference point $O_2$ (for example, the second reference point $O_2$ functions as a reference about which the two second hollowed features 202 have central symmetry; and since the two second hollowed features 202 are provided opposite to each other in the second direction y, then an axis which is parallel to the first direction x and passes through the second reference point $O_2$ functions as an axis with respect to which the two second hollowed features 202 have mirror symmetry, i.e., for short, the second reference $O_2$ also functions as a reference of mirror symmetry of the two second hollowed features 202). Therefore, the second reference point $O_2$ is hereinafter referred to as a symmetrical center of the two second hollowed features 202. Furthermore, a coordinate value of the first reference point $O_1$ in the first direction x and a coordinate value of the second reference point $O_2$ in the first direction x are set such that a difference between these two coordinate values is expected to be a first constant. Moreover, in an ideal condition, the first constant is for example set to be zero, that is, the difference between the coordinate value of the first reference point $O_1$ in the first direction x and the coordinate value of the second reference point $O_2$ in the first direction x is the first constant having a value of zero (that is, the coordinate value of the first reference point $O_1$ in the first direction x and the coordinate value of the second reference point $O_2$ in the first direction x should be equal at this time).

Figure 2B:
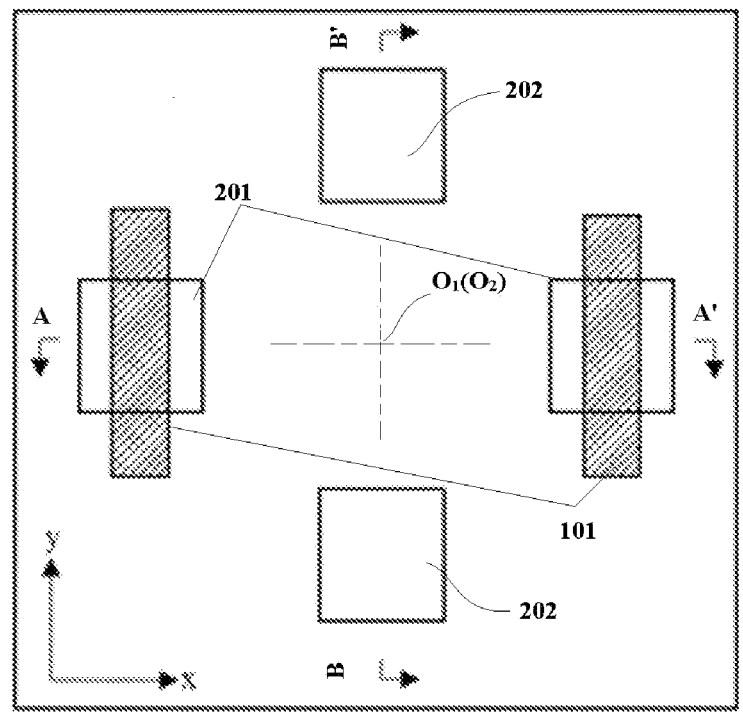
FIG. 2(b) shows a top view of a schematic layout of a typical example of the overlay alignment mark as described in FIG. 2(a)

As shown in FIG. 3(a) and FIG. 3(b), the first reference point $O_1$ and the second reference point $O_2$ are essentially respective projection points of two axes on the wafer both of which are respectively presented as the first axis and the second axis along the normal direction of the wafer in the sectional views of FIG. 3(a) and FIG. 3(b), and therefore these two reference points are each in the form of dot shape as illustrated in the top views of FIG. 2(a) and FIG. 2(b).

FIG. 2(b) shows a top view of a schematic layout of a typical example of the overlay alignment mark as described in FIG. 2(a). In a typical embodiment, for example as shown in FIG. 2(b), the coordinate value of the first reference point $O_1$ in the first direction x and the coordinate value of the second reference point $O_2$ in the first direction x are designed such that the difference therebetween is expected to be the first constant, and a coordinate value of the first reference point $O_1$ in the second direction y and a coordinate value of the second reference point $O_2$ in the second direction y are designed such that a difference therebetween is expected to be a second constant; and, in an ideal condition, the first constant is for example set to be zero, that is, the difference between the coordinate value of the first reference point $O_1$ in the first direction x and the coordinate value of the second reference point $O_2$ in the first direction x is the first constant having a value of zero (that is, the two coordinate values should be equal at this time); and the second constant is set to be zero, that is, the difference between the coordinate value of the first reference point $O_1$ in the second direction y and the coordinate value of the second reference point $O_2$ in the second direction y is the second constant having a value of zero (i.e., the two coordinate values should be equal at this time). That is to say, the first reference point $O_1$ and the second reference point $O_2$ are designed such that they are expected to coincide with each other ideally.

With such a specific setting, a deviation between the coordinate value of the first reference point $O_1$ (which functions as the symmetrical center of the two first solid features 101) in the first direction x as practically measured and the coordinate value of the second reference point $O_2$ (which functions as the symmetrical center of the two second hollowed features 202) in the first direction x can be simply calculated (the difference between the coordinate value of the symmetrical center $O_1$ of the two first solid features 101 in the first direction x and the coordinate value of the symmetrical center $O_1$ of the two second hollowed features 202 in the first direction x is supposed/expected in the design to be the first constant, for example zero), on the basis of the single-pass SEM image which is acquired for both the first layer 1 and the second layer 2 which overlap at least partially with each other, so as to obtain a component of the overlay error between the current layer and the previous layer for example in the first direction x.

Some Embodiments of Overlay Error Based on Overlay Alignment Mark

According to some embodiments of the present disclosure, based on the basic embodiment of the overlay alignment mark as described above, and furthermore, in a condition that the overlay alignment mark is formed in two layers of the wafer, and a difference between coordinate values of centers of respective portions of the overlay alignment mark in the two layers (for example, the symmetrical centers of respective features (the solid features or the hollowed features) functioning as the first reference point $O_1$ and the second reference point $O_2$, as mentioned above, respectively) in one direction is a constant (typically, for example, the difference is zero, that is, these two coordinates values are equal to each other), then at least the deviation in such a direction (for example, the first direction x), in the overlay error between the two layers, can be calculated.

For example, the overlay error between different layers of the wafer, for example, the overlay error between the first layer 1 and the second layer 2, at least comprises a deviation between the first layer and the second layer in the first direction, which is defined by subtracting the first constant (e.g., zero as mentioned above) from a deviation between the first pattern 10 and the second pattern 20 in the first direction x; here the deviation between the first layer and the second layer in the first direction is a component of the overlay error in the first direction x, and is for example also referred to as an x-component deviation.

Specifically, by way of example, the deviation between the first pattern 10 and the second pattern 20 in the first direction x is for example directly defined as a difference between the coordinate value of the first reference point $O_1$ in the first direction x as practically measured and the coordinate value of the second reference point $O_2$ in the first direction x (the difference between the coordinate value of the first reference point $O_1$ in the first direction x and the coordinate value of the second reference point $O_2$ in the first direction x is supposed/expected in the design to be the first constant, for example zero).

Figure 5:
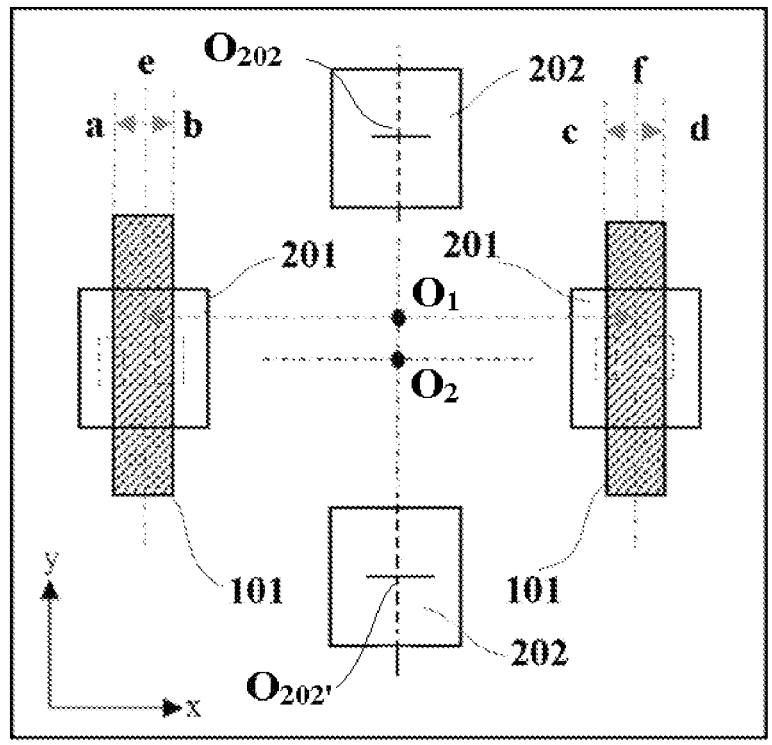
FIG. 5 schematically shows that an overlay error between two different layers are calculated depending on the overlay alignment mark as illustrated in FIG. 2(a), according to embodiments of the present disclosure.

FIG. 5 schematically shows that an overlay error between two different layers are calculated depending on the overlay alignment mark as illustrated in FIG. 2(a), according to embodiments of the present disclosure. Thus, based on the arrangement of the overlay alignment mark as above, especially respective arrangements of the first pattern 10 and the second pattern 20 thereof, then in a condition that the overlay alignment mark is formed in two layers of the wafer, and a difference between coordinate values of centers of respective portions of the overlay alignment mark in the two layers (for example, symmetrical centers of respective sub-patterns functioning as the first reference point $O_1$ and the second reference point $O_2$, as mentioned above, respectively) in a same single direction (the first direction x, or the second direction y) is a constant (for example, the first constant or the second constant), then the overlay error between different layers of the wafer (here, the two layers) for example has a first definition, e.g., as shown in FIG. 5, at least comprising: the deviation between the first pattern 10 and the second pattern 20 in the same single direction minus the first constant or the second constant in such direction; specifically, the difference between the coordinate value of the symmetrical center $O_1$ of the two first solid features 101 for example in the first direction x and the coordinate value of the symmetrical center $O_2$ of the two second hollowed features 202 for example in the first direction x (this difference is supposed/expected in the design to be the first constant, for example zero) directly functions as the deviation between the first pattern 10 and the second pattern 20 in such direction, and then the constant in such direction is subtracted from this deviation, with the result thus obtained being regarded as a component of the overlay error between the current layer and the previous layer, for example in such direction.

Based on the above basic embodiment of overlay alignment mark and the first definition of the deviation between two layers in the first direction x, in some embodiments, for example as shown in FIG. 5, in a condition that the two first solid features 101 as shown in the figures are designed such that they not only have central symmetry, to each other, about the first reference point $O_1$, but also have mirror symmetry to each other with respect to the first reference point $O_1$, thereby the first reference point $O_1$ functions as the symmetrical center of the two first solid features 101, then, the coordinate value of the first reference point $O_1$ in the first direction x is obtained, by extracting side edges of each first solid feature 101 to obtain centerline thereof extending in the second direction y and in turn calculating a mean value of respective centerlines of the two first solid features 101 extending in the second direction y. For example, by performing edge extraction along the second direction y for the respective first solid sub-images imaged from each first solid feature 101 in a single-pass SEM image, centerlines of the two first solid sub-image extending in the second direction y can be obtained, and then a mean value of coordinate values, in the first direction x, of the centerlines of the two first solid sub-images extending in the second direction y is calculated.

In a specific embodiment, for example as shown in FIG. 5, the coordinate value of the first reference point $O_1$ in the first direction x is further defined as a mean value, in the first direction x, of the coordinate values of the respective centerlines, parallel to the second direction y, of the two first solid features 101, which not only have central symmetry to each other about the first reference point $O_1$ but also have mirror symmetry to each other with respect to the first reference point $O_1$.

In a more specific embodiment, for example, as shown in FIG. 5, the coordinate value of the centerline, parallel to the second direction y, of each first solid feature 101 in the first direction x is further defined as the mean value of the coordinate values of two opposite side edges of each first solid feature 101 extending in the second direction y in the first direction x. Thus, the coordinate value of the first reference point in the first direction is defined as a half of a sum of mean values of coordinate values of respective two opposite side edges of the pair of solid features 101 in the first direction.

In specific implementation, the edge extraction and coordinate calculation of each first solid feature 101 can be implemented by performing edge extraction in the single-pass SEM image based on edge extraction of the respective first solid sub-image which is imaged from each first solid feature 101 through the respective first hollowed feature 201 overlapping therewith. For example, as shown in FIG. 5, above all, on the SEM image, measurement points are set on the two first solid sub-images at four side edges thereof (two side edges for each first solid sub-image) extending substantially in the second direction and being presented in two pairs, in each pair of which respective two side edges therein are opposite to each other in the first direction; and then, as shown in FIG. 5, the coordinate values of the measurement points on the four side edges in the first direction (for example labeled by a, b, c, d as illustrated) are obtained by measurement; next, based on the aforementioned measurement points on the four side edges which are already extracted from the SEM image, coordinate values e, f of respective central locations of the two first solid sub-images in the direction x are calculated, depending on two equations of $e=(a+b)/2$, and $f=(c+d)/2$; finally, a mean value thereof (that is, $(e+f)/2$), i.e., a mean value of coordinate values of the centerlines of the two first solid sub-images extending in the second direction y, in the first direction x can be calculated, which functions as the coordinate value of the first reference point $O_1$ in the first direction x. That is to say, the mean value, in the first direction x, of the coordinate values of two opposite side edges of each first solid feature 101 extending in the second direction y is practically considered to be equal to the mean value of the coordinate values, in the first direction x, of the two opposite side edges of each first solid sub-image extending in the second direction y in the single-pass SEM image.

In other words, when the component of the overlay error between the current layer and the previous layer in the first direction x is calculated based on the first definition, for example, by extracting two side edges of each first solid feature 101 extending in the second direction y and calculating a mean value of coordinates thereof (for example, by extracting two side edges of each first solid sub-image extending in the second direction y in the single-pass SEM image; and then, by calculating the mean value of the coordinate values thereof), thus the coordinate value, in the first direction x, of respective centerline of each first solid feature 101 extending in the second direction y is obtained; and then, by calculating the mean value of coordinate values, in the first direction x, of respective centerlines of the two first solid features 101 extending in the second direction y, finally, the coordinate value of the symmetrical center $O_1$ of the two first solid features 101 for example in the first direction x is obtained.

Figure 7A:
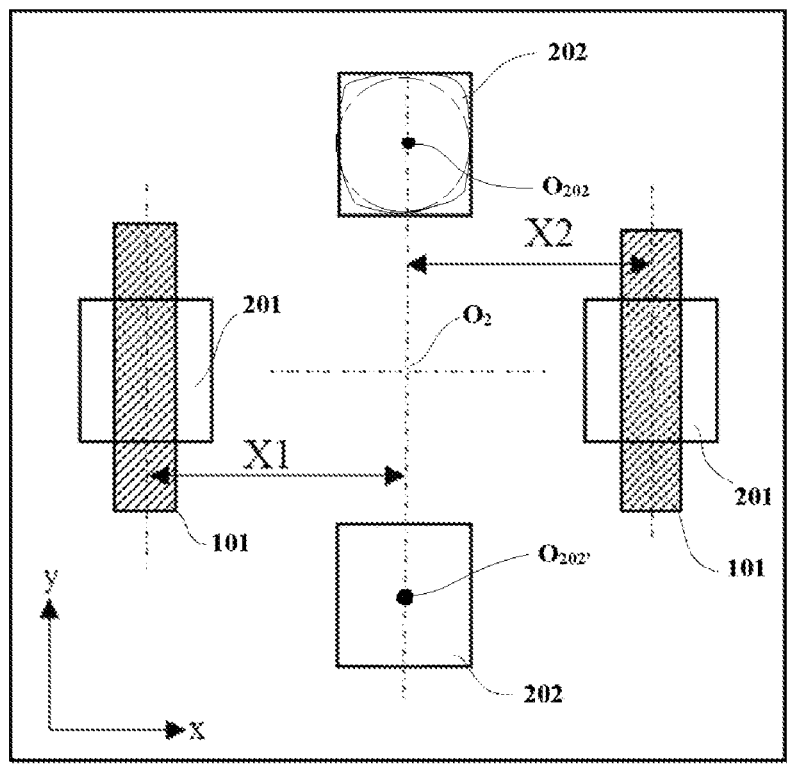
FIG. 7(a) schematically shows that, the coordinate value of the first reference point of the first pattern in the first direction is obtained, based on the second definition, according to other embodiments of the present disclosure.
Figure 7B:
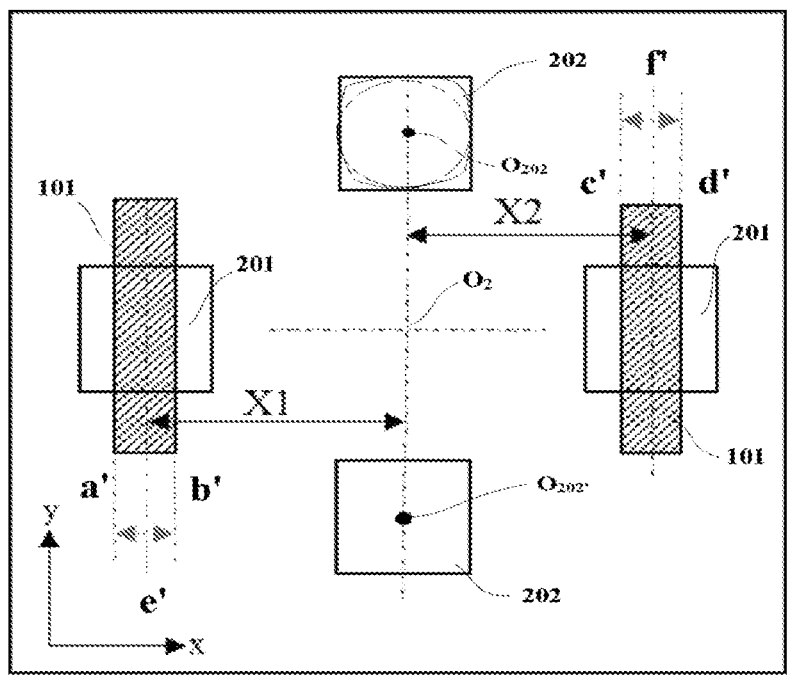
FIG. 7(b) schematically shows a more specific way by which the coordinate value of the first reference point in the first direction as shown in FIG. 7(a)

And, based on the above basic embodiment of overlay alignment mark and the first definition of the deviation between two layers in the first direction x, for example, in some embodiments, in a condition that the two second hollowed features 202 for example as illustrated in FIG. 7(a) and FIG. 7(b) which do not overlap with the two first solid features 101 at all (i.e., the other pair of hollowed features of the two pairs of hollowed feature being different from said respective pair of hollowed features) are designed such that a mean value between the coordinate values of respective geometric centers of the two second hollowed features 202 in the first direction is the same as the coordinate value of the second reference point in the first direction and thus the second reference point $O_2$ functions as the symmetrical center of the two second hollowed features 202, then, geometrical centers $O_{202}$, $O_{202}'$ are obtained/found by graphical fitting of each second hollowed feature 202, and then respective coordinate values of the geometrical centers $O_{202}$, $O_{202}'$ are acquired and in turn a mean value of the respective coordinate values of the geometrical centers $O_{202}$, $O_{202}'$ in the first direction x is calculated (for example, by performing graphical fitting for the respective second hollowed sub-images as imaged from each second hollowed feature 202 in the single-pass SEM image to be a pattern (for example, a circle pattern or an ellipse pattern), and extracting the coordinate values, in the first direction x, of the geometric centers of respective patterns as obtained by the graphical fitting of the two second hollowed sub-images and in turn calculating the mean value of these coordinate values of the geometric centers), the coordinate values of the second reference point $O_2$ in the first direction x is thus obtained. In a more typical embodiment, for example, the other pair of hollowed features, which are different from the respective pair of hollowed features, are designed such that the coordinate values of respective geometric centers thereof in the first direction are the same as each other.

In a specific embodiment, for example, the coordinate value of the second reference point $O_2$ in the first direction x is further defined as: the mean value of the coordinate values, in the first direction x, of the geometric centers of the two second hollowed features 202 which fail to overlap with the two first solid features 101 at all and not only have central symmetry to each other about the second reference point $O_2$ but also have mirror symmetry to each other with respect to the second reference point $O_2$.

In a more specific embodiment, for example, the geometric center of each second hollowed feature 202 is further defined as a geometric center of the pattern (for example, the circle pattern or the ellipse pattern as illustrated) obtained by fitting from the second hollowed feature 202.

In the specific implementation, the graphical fitting of each second hollowed feature 202 and in turn calculation of coordinates of geometric centers of the patterns as obtained by graphical fitting, are implemented, by performing graphical fitting of the respective second hollowed sub-image as imaged from each second hollowed feature 202 and extracting geometric centers of fitted patterns, in the single-pass SEM image. By way of example, in a condition that each second hollowed feature 202 is designed in the form of a square section, typically, the respective second hollowed sub-image in the single-pass SEM image is fitted into a circle shape via a graphical fitting method; more specifically, for example, an outer circle which completely surrounds edges of the respective sub-image, and an inner circle which completely falls inside the edges of the respective sub-image, are above all constructed respectively, and the outer circle gradually shrinks inwards and the inner circle gradually expand outwards such that the outer circle and the inner circle gradually approach each other until both the outer circle and the inner circle get in a point-contact with (i.e., touch) edge(s) of the respective sub-image. At this time, a circle located in a closed loop region between the inner circle and the outer circle is further defined as a fitted circle. Or alternatively, for example, in a condition that each second hollowed feature 202 is designed in the form of a rectangular section, an ellipse can be fitted for the respective second hollowed sub-image in a similar way that the outer circle and the inner circle approach each other, one from outer side while the other from inner side of the respective second hollowed sub-image. The ellipse pattern is for example a positive ellipse (i.e., a standard ellipse rather than an inclined ellipse) having a major axis parallel to the first direction x and a minor axis parallel to the second direction y; or the ellipse pattern is for example an inclined ellipse having a major axis which is inclined at a non-zero angle with respect to the first direction x and at another non-zero angle with respect to the second direction y.

Figure 6:
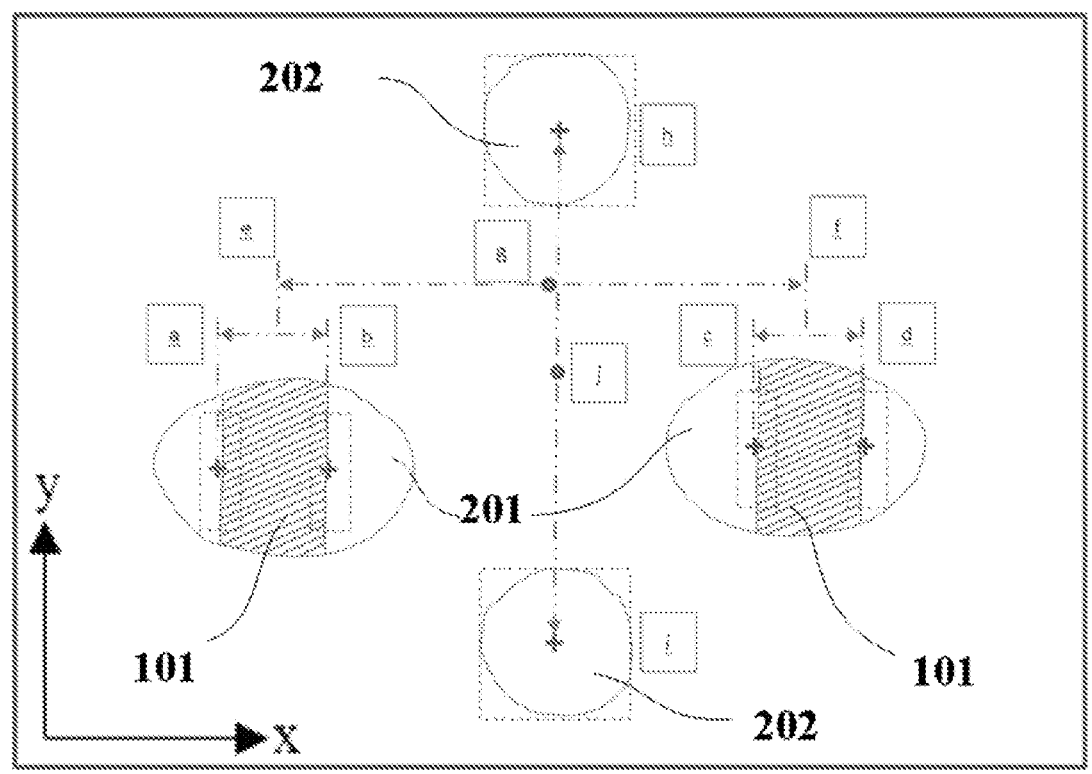
FIG. 6 schematically shows that in the pattern formed after practical processing as shown in FIG. 1(b), the coordinate value of the first reference point of the first pattern in the first direction is obtained based on the first definition, and the coordinate value of the second reference point of the second pattern in the first direction is obtained by the graphical fitting.

FIG. 6 schematically shows that in the pattern formed after practical processing as shown in FIG. 1(*b*), the coordinate value of the first reference point of the first pattern in the first direction is obtained based on the first definition, and the coordinate value of the second reference point of the second pattern in the first direction is obtained by the graphical fitting, without providing a specialized overlay alignment mark. In a further extended embodiment, for example as shown in FIG. 6, based on the existing pattern on the wafer (e.g., the geometric patterns of a chip itself), with aforementioned first definition of the deviation in the overlay error, in at least one direction, then a portion of graphic features of the existing patterns on both the previous layer and the current layer can be used as the overlay alignment mark, without forming a specialized/dedicated overlay alignment mark. Thus, the component of the overlay error between the current layer and the previous layer, for example in the first direction x, is obtained in relatively simplified step(s). And more specifically, for example, hollowed features having respective strip-shaped section are for example a plurality of through-holes each of which is designed in the form of rectangular-shape or circular-shape. And more specifically, for example, each solid feature having a strip-shaped section is a structure such as a column-shaped structure, a truncated cone-shaped structure or the like which is formed in the first layer 1 or projects from a surface of another material layer below the first layer 1.

By way of example, as shown in FIG. 6, above all, on the SEM image, measurement points are set on the two first solid sub-images at four side edges thereof (two side edges for each first solid sub-image) extending substantially in the second direction and being presented in two pairs, in each pair of which respective two side edges therein are opposite to each other in the first direction; and then, as shown in FIG. 5, the coordinate values of the measurement points on the four side edges in the first direction (for example labeled by a, b, c, d as illustrated) are obtained by measurement; next, based on the aforementioned measurement points on the four side edges which are already extracted from the SEM image, coordinate values e, f of respective central locations of the two first solid sub-images in the direction x are calculated, depending on two equations of e=(a+b)/2, and f=(c+d)/2; finally, a mean value thereof (that is, g=(e+f)/2), i.e., a mean value 'g' of coordinate values of the centerlines of the two first solid sub-images extending in the second direction y, in the first direction can be calculated, which functions as the coordinate value of the first reference point $O_1$ in the first direction x. Moreover, in the single-pass SEM image, a graphical fitting is performed on the second hollowed sub-images imaged correspondingly from the second hollowed features, so as to obtain the coordinate values, in the first direction x, (which are labeled by 'h', 'i', as illustrated) of the geometric centers of the two second hollowed sub-images as illustrated, and then a mean value of the coordinate values h, i, in the first direction x, of the geometric centers of the two second hollowed sub-images can be calculated, that is, j=(h+i)/2, then the mean value 'j' functions as the coordinate value of the second reference point $O_2$ in the first direction x. As such, the deviation between the first pattern and the second pattern in the first direction x is (g-j); and next, the first constant is subtracted from such deviation between said two patterns in the first direction x, with the result functioning as the deviation between the first layer and the second layer in the first direction x.

In a further extended embodiment, for example as shown in FIG. 1(*c*), assuming that the upper-layer pattern formed in the second layer 2 (i.e., the current layer) of the wafer comprises a plurality of through-holes arranged in an array, then, the two pairs of hollowed features comprise: the first pair of through-holes arranged in one of both a row direction and a column direction of the array, and the second pair of through-holes arranged in the other of both a row direction and a column direction of the array, in the plurality of through-holes. And respective two opposite side edges of the strip-shaped sections of the pair of solid features extending in one of the row direction and the column direction are at least partially exposed from a respective pair of the first pair of through-holes and the second pair of through-holes, and the lower-layer pattern formed in the first layer 1 of the wafer (i.e., the previous layer) comprises a pair of solid features which have strip-shaped sections and are at least partially observable through the respective pair of hollowed features, respectively. Thereby, the two solid features function as the two first solid features 101 of the first pattern 10 respectively, and the two hollowed features which fail to overlap with the two first solid features 101 at all then function as the two second hollowed features 202 of the second pattern 20 respectively. And the two mutually orthogonal directions may function as the first direction x and the second direction y as described above, respectively, e.g., the row direction and the column direction here. As such, based on the first definition of the deviation in at least one direction in the overlay error as described above, then a portion of graphic features of the existing pattern on both the previous layer and the current layer can be used as the overlay alignment mark, without forming a specialized/ dedicated overlay alignment mark. Thus, the component of the overlay error between the current layer and the previous layer, for example in the first direction x, is obtained in relatively simplified step(s).

In alternative or additional embodiments, for example, under the same assumptions, by alternatively rotating the overlay alignment mark by 90 degrees, or by additionally setting another overlay alignment mark having the same patterns s the current overlay alignment mark but having its own orientation orthogonal to that of the current overlay alignment mark (for example, by providing the other overlay alignment mark having its patterns being the same as that of the current overlay alignment mark but its orientation being rotated 90 degrees as compared with that of the current overlay alignment mark, thus the first pattern 10 and the second pattern 20 of the other overlay alignment mark are specifically arranged such that, these patterns' respective arrangements in the first direction x and the second direction y respectively are just opposite to those of pattern's in the overlay alignment mark as mentioned in the previous embodiments (for example, in the other overlay alignment mark, the direction y essentially functions as its first direction and the direction x functions as its second direction)), then it facilities that, a portion of graphic features of the existing pattern on both the previous layer and the current layer can be used as the overlay alignment mark, based on the first definition of the deviation in at least one direction in the overlay error as described above, without forming a specialized/dedicated overlay alignment mark. Thus, the component of the overlay error between the current layer and the previous layer, for example in the second direction y, is obtained in relatively simplified step(s), without repeating details of such embodiments herein any more.

In addition, in order to obtain the coordinate value of the first reference point in the first direction, another setting is proposed in alternative embodiments of the present disclosure.

Assuming that there exist two layers overlapping with each other, such as a reference layer and an offset layer, then, in a condition that there are two parallel strip-shaped patterns which are provided in the offset layer and are presented to be symmetric to each other (e.g., have mirror symmetry to each other) with respect to a point O in the reference layer, a Cartesian coordinate system is established, with the point O functioning as an origin of the coordinate system and an extension direction of the two strip-shaped patterns function as vertical direction y of the Cartesian coordinate system; and in the direction x perpendicular to the direction y of the Cartesian coordinate system, an initial coordinate value of a centerline of the left one of the two strip-shaped patterns extending in the direction y of the Cartesian coordinate system is −d, while an initial coordinate value of a centerline of the right one of the two trip-shaped patterns extending in the direction y of the Cartesian coordinate system is accordingly +d, then a distance between each of the two centerlines of the two patterns extending in the direction y and the origin O is d, i.e., each of distances X1, X2, as illustrated, is d. Then, the offset layer is displaced, relative to the reference layer, and a component of the displacement in the direction x is $\Delta d$ as illustrated; as such, in the direction x, the coordinate value of the centerline of the left one of the two strip-shaped patterns extending in the direction y becomes −d+$\Delta d$ accordingly, and the coordinate value of the centerline of the right one of the two-shaped patterns extending in the direction y becomes d+$\Delta d$ accordingly. Thereby, the distance X1 between the centerline of the left one of the two strip-shaped patterns extending in the direction y and the origin O becomes [0−(−d+$\Delta d$)], and the distance X2 between the centerline of the right one of the two strip-shaped patterns extending in the direction y and the origin O becomes [(d+$\Delta d$)−0], then, an absolute value of a difference value between the two distances is equal to 2$\Delta d$, i.e., |X1−X2|=2$\Delta d$. Then, for two strip-shaped patterns symmetrically located on the offset layer with respect to the origin O on the reference layer and extending in one direction (the direction y, or the direction x orthogonal to direction y), the absolute value of the difference value between respective distances between respective centerlines of the two strip-shaped patterns in said one direction and the origin O can be considered to be equal to twice of the displacement of the offset layer relative to the reference layer in the other direction orthogonal to said one direction (the other direction referring to the direction x, or the direction y orthogonal to the direction x). Based on this principle, in a condition that the symmetrical center of the first pattern 10 in the first layer 1 (i.e., the first reference point $O_1$) coincides with the symmetrical center of the second pattern 20 of the second layer 2 (i.e., the second reference point $O_2$), or even slightly deviates from each other in advance (for example, at least one of the difference between the coordinate values of the two symmetrical centers in the first direction and the difference between the coordinate values of the two symmetrical centers in the second direction is constant), then a second definition of the overlay error between the first layer 1 and the second layer 2 of the wafer to be detected can be established.

FIG. 7(a) schematically shows that, the coordinate value of the first reference point of the first pattern in the first direction is obtained, based on the second definition, according to other embodiments of the present disclosure. Thus, based on the arrangement of the overlay alignment mark as above, especially respective arrangements of the first pattern 10 and the second pattern 20 thereof, then in a condition that the overlay alignment mark is formed in two layers (i.e., the current layer and the previous layer) of the wafer, and a difference between coordinate values of centers of respective portions of the overlay alignment mark in the two layers (for example, the first reference point $O_1$ and the second reference point $O_2$, as above) in the first direction x is a first constant (the first constant is typically zero, for example), that is, the first reference point $O_1$ and the second reference point $O_2$ are slightly offset from each other in advance (for example, the difference between the two coordinate values in the first direction is a constant), then, the overlay error between the two layers for example has a second definition. Specifically, the definition of the deviation in the overlay error between the first layer 1 and the second layer 2 in the first direction x, for example as shown in FIG. 7(a), at least comprises: the deviation between the first pattern 10 and the second pattern 20 in the first direction x minus the first constant, the deviation between the first pattern 10 and the second pattern 20 in the first direction x being defined as ½ of a difference between distances between respective centerlines of the two solid features 101 parallel to the second direction y and the second reference point $O_2$ (i.e., |X1−X2|/2), as illustrated).

FIG. 7(b) schematically shows a more specific way by which the coordinate value of the first reference point in the first direction is calculated as shown in FIG. 7(a). Based on the above basic embodiment of overlay alignment mark and the second definition of deviation between the two layers in the first direction x, in some embodiments, for example, as shown in FIG. 7(b), in a condition that the two first solid features 101 are designed such that they not only have central symmetry to each other about the first reference point $O_1$ but also have mirror symmetry to each other with respect to the first reference point $O_1$, and the two second solid features 102 are designed such that the first reference point $O_1$ and the second reference point $O_2$ are slightly offset from each other in advance (for example, at least one of the difference between the coordinate values of the two symmetrical centers in the first direction and the difference between the coordinate values of the two symmetrical centers in the second direction is constant; further, when both the difference between the coordinate values of the two symmetrical centers in the first direction and the difference between the coordinate values of the two symmetrical centers in the second direction are zero, i.e., two constants are zero, then, the first reference point $O_1$ and the second reference point $O_2$ coincide with each other), for example, the coordinate values of the first reference point $O_1$ in the first direction x and the second reference point $O_2$ in the first direction x are designed such that the difference between the coordinate values is constant, by extracting side edges of each first solid feature 101, centerline thereof extending in the second direction y can be obtained.

In a specific embodiment, for example as shown in FIG. 7(b), a distance between respective centerline of each first solid feature 101 parallel to the second direction y and the second reference point $O_2$, i.e., each of distances between respective centerlines of the pair of solid features parallel to the second direction and the second reference point, is defined as: an absolute value of a difference between the coordinate value, in the first direction x, of respective centerline of each first solid feature 101 parallel to the second direction y and the coordinate value of the second reference point $O_2$ in the first direction x.

In a more specific embodiment, for example as shown in FIG. 7(b), the coordinate value, in the direction x, of respective centerline of each first solid feature 101 parallel to the second direction y is defined as a mean value of the coordinate values, in the first direction, of respective two opposite side edges of each first solid feature 101 extending in the second direction y, i.e., e'=(a'+b')/2 and f=(c'+d')/2, as illustrated. In the specific implementation, by way of example, this is realized by performing edge extraction along the second direction y for the respective first solid sub-images imaged from each first solid feature 101 in a single-pass SEM image so as to obtain centerlines of the two first solid sub-image extending in the second direction y.

As such, with the single-pass SEM image which is acquired for both the first layer 1 and the second layer 2 which overlap at least partially with each other, for example, by performing graphical fitting for each of the two second hollowed sub-images as imaged from the two second hollowed features 202 which are symmetrical with respect to the symmetrical center $O_2$, the coordinate value of the second reference point (that is, the symmetrical center $O_2$ of the two second hollowed features 202) in the first direction x can be obtained; and based on the first definition or the second definition of the deviation in at least one direction in the overlay error as described above, the coordinate value of the first reference point (that is, the symmetrical center $O_1$ of the two first solid features 101) in the first direction x is obtained, by extracting side edges of each of the two solid sub-images as imaged from the two first solid features 101 which are symmetrical with respect to the symmetrical center $O_1$ and calculating the mean value of coordinates of the side edges. Therefore, it facilities a calculation of a deviation between the coordinate value of the first reference point $O_1$ (which functions as the symmetrical center of the two first solid features 101) in the first direction x as practically measured and the coordinate value of the second reference point $O_2$ (which functions as the symmetrical center of the two second hollowed features 202) in the first direction x (the difference between the coordinate value of the symmetrical center $O_1$ of the two first solid features 101 in the first direction x and the coordinate value of the symmetrical center $O_2$ of the two second hollowed features 202 in the first direction x is supposed/expected in the design to be the first constant, for example zero), and in turn the first constant is subtracted from the deviation as calculated above, thus, the component of the overlay error between the current layer and the previous layer, for example in the first direction x, is obtained in relatively simplified step(s).

Moreover, in an alternative embodiment of the present disclosure, for example, with a setting similar to a setting as above where the coordinate value, in the first direction x, of respective centerline of each first solid feature 101 extending in the second direction y can be obtained by performing edge extraction for each first solid feature 101, then, the coordinate value, in the first direction x, of respective centerline of each second hollowed feature 202 extending in the second direction y can also be obtained by performing edge extraction for each second hollowed feature 202, thereby the coordinate value of the second reference point in the first direction x can further be obtained by averaging, without repeating details of such embodiments herein any more.

In alternative or additional embodiments, for example, under the same assumptions, by alternatively rotating the overlay alignment mark by 90 degrees, or by additionally setting another overlay alignment mark having the same patterns s the current overlay alignment mark but having its own orientation orthogonal to that of the current overlay alignment mark (for example, by providing the other overlay alignment mark having its patterns being the same as that of the current overlay alignment mark but its orientation being rotated 90 degrees as compared with that of the current overlay alignment mark, thus the first pattern 10 and the second pattern 20 of the other overlay alignment mark are specifically arranged such that, these patterns' respective arrangements in the first direction x and the second direction y respectively are just opposite to those of pattern's in the overlay alignment mark as mentioned in the previous embodiments (for example, in the other overlay alignment mark, the direction y essentially functions as its first direction and the direction x functions as its second direction)), then it facilities that, a portion of graphic features of the existing pattern on both the previous layer and the current layer can be used as the overlay alignment mark, based on the first definition of the deviation in at least one direction in the overlay error as described above, without additionally forming a specialized/dedicated overlay alignment mark. Thus, the component of the overlay error between the current layer and the previous layer, for example in the second direction y, is obtained in relatively simplified step(s), without repeating details of such embodiments herein any more.

According to the general technical concept of embodiments of the disclosure, on the other hand, in the other aspect of embodiments of the disclosure, a method for measuring overlay error is also provided, comprising: providing the overlay alignment mark as above; and measuring an overlay error between different layers of the wafer by measuring a deviation between portions of the overlay alignment mark which are located in the different layers of the wafer.

Figure 8:
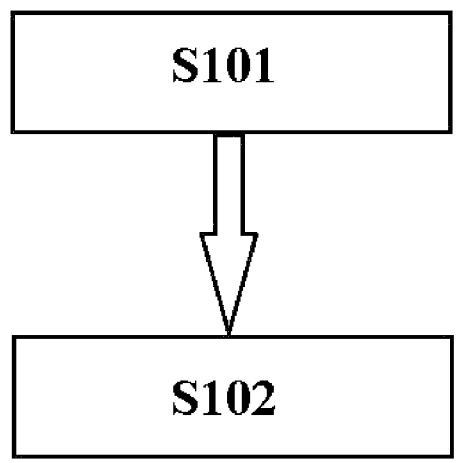
FIG. 8 shows a method for measuring overlay error according to an embodiment of the present disclosure.

FIG. 8 shows a method for measuring overlay error according to an embodiment of the present disclosure.

By way of example, a basic embodiment of a method for measuring overlay error is provided, for example, as shown in FIG. 8 and in view of FIG. 1(a) to FIG. 2(b) as above, the method comprising:

S101: providing an overlay alignment mark in a patterned wafer having both a lower-layer pattern in a first layer thereof and an upper-layer pattern in a second layer thereof above the first layer; and S102: measuring an overlay error between different layers of the wafer by measuring a deviation between portions of the overlay alignment mark which are located in the different layers of the wafer.

Figure 9:
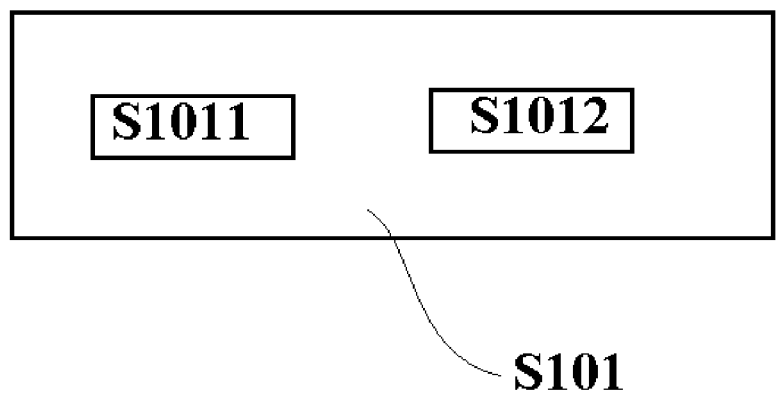
FIG. 9 schematically illustrates a schematic block diagram of step S101 of the method for measuring overlay error as shown in FIG. 8 in a condition that the overlay alignment mark is formed in two layers.

FIG. 9 schematically illustrates a schematic block diagram of step S101 of the method for measuring overlay error as shown in FIG. 8 in a condition that the overlay alignment mark is formed in two layers.

Specifically, as shown in FIG. 9, step S101, i.e., "providing an overlay alignment mark in a patterned wafer" for example comprises:

S1011: selecting a portion of the lower-layer pattern, which portion comprises a pair of solid features 101 formed in the first layer 1, as a first pattern 10; and S1012: selecting a portion of the upper-layer pattern, which portion comprises two pairs of hollowed features 201, 201 formed in the second layer 2 with two imaginary lines connecting between geometric centers of respective pairs in the two pairs of hollowed features 201, 202 extending in two mutually orthogonal directions respectively, as a second pattern 20, wherein an orthographic projection of the pair of solid features 101 on the wafer at least partially overlaps with an orthographic projection of a respective pair of hollowed features 201 of the two pairs of hollowed features 201, 202 on the wafer.

In a further embodiment of the present disclosure, for example as shown in the figure, step S1011, i.e., "selecting a portion of the lower-layer pattern as a first pattern 10", comprises: selecting two solid patterns 101 having strip-shaped sections in the first layer 1 respectively as the pair of solid features, both of which not only have central symmetry, to each other, about a first reference point $O_1$ located therebetween in the first layer, but also have mirror symmetry to each other with respect to the first reference point $O_1$; and step S1012, i.e., "selecting a portion of the upper-layer pattern as a second pattern 20 comprises: selecting two pairs of through-holes 201, 202 having rectangular sections in the second layer 2 respectively as the two pairs of hollowed features, with the two imaginary lines connecting between geometric centers of respective pairs in the two pairs of through-holes 201, 202 extending in the two mutually orthogonal directions respectively (more specifically, the imaginary lines connecting between geometric centers of the first pair of through-holes 201 and the imaginary line connecting between geometric centers of the second pair of through-holes 202 extend in two directions orthogonal to each other, respectively), wherein the pair of solid features 101 are at least partially observable through one pair of through-holes 201, which functions as the respective pair of hollowed features, and the other pair of through-holes 202 not only have central symmetry about a second reference point $O_2$ in the second layer but also have mirror symmetry to each other with respect to the second reference point $O_2$. And a direction in which the imaginary line connecting between geometric centers of the respective pair of hollowed features extend is set as a first direction, (e.g., a horizontal direction x of the rectangular coordinate system as a reference coordinate system as illustrated in the lower left corner of FIG. 2(a)), and respective two opposite side edges of the strip-shaped sections of the pair of solid features extend in a second direction (e.g., a vertical direction y of the rectangular coordinate system as the reference coordinate system as illustrated in the lower left corner of FIG. 2(a)), perpendicular to the first direction, of the two mutually orthogonal directions and are at least partially exposed from the respective pair of hollowed features More specifically, for example, in view of the specific layered arrangement of the overlay alignment mark shown in FIG. 2(a) as schematically illustrated in FIG. 3(a) and FIG. 3(b), then, while performing a single-pass (i.e., single-shot) SEM imaging on the second pattern of the second layer 2, the first pattern 10 (specifically, the two first solid features 101) in the first layer 1 which is at least partially observable through the two first hollowed features 201 can also be imaged. And in the single-pass SEM image as obtained, respective portions thereof which are imaged from the two first hollowed features 201, the two second hollowed features 202, and the two first solid features 101 respectively are for example referred to as "first hollowed sub-images", "second hollowed sub-images" and "first solid sub-images", respectively. Then, in the single-pass SEM image, side edges of a respective first solid sub-image (e.g., outer side edge 11 and inner side edge 12, both of which extend in the second direction y as illustrated in FIG. 2(a)) as imaged from side edges of each first solid feature 101, are at least partially exposed from and are thus observable through a respective first hollowed sub-image as imaged from a respective first hollowed feature 201 which overlaps with said first solid feature 101

As such, it avoids moving the SEM apparatus for many times during a layer-by-layer acquisition of SEM images by scanning thereby and an interference thus caused on measurement of the overlay error as applied by a displacement of the SEM apparatus relative to specific locations of the wafer to be scanned by electron beam emitted from the SEM apparatus, then it is not necessary to adjust energy of the electron beam of the SEM apparatus for many times; and the overlay error between the current layer and the previous layer (and more specifically, for example, a component of the overlay error for example in the first direction x), can be calculated based on the single-pass SEM image by acquiring the SEM image only once, simplifying steps of measuring the overlay error.

In a further extended embodiment, for example, in view of FIG. 1(c), assuming that in the second layer (i.e., the current layer) of the wafer, the upper-layer pattern of the wafer comprises a plurality of through-holes arranged in an array, and then "selecting two pairs of through-holes 201, 202 having rectangular sections in the second layer 2 respectively as the two pairs of hollowed features" comprises: selecting a first pair of through-holes 201 arranged in one of both a row direction and a column direction of the array, and a second pair of through-holes 202 arranged in the other of both the row direction and the column direction of the array, in the plurality of through-holes, wherein respective two opposite side edges ($I_1$, $I_2$) of the strip-shaped sections of the pair of solid features 101 extending in one of the row direction and the column direction are at least partially exposed from a respective pair of the first pair of through-holes 201 and the second pair of through-holes 202, for example, the first pair of through-holes 201.

Therefore, for the patterned wafer whose various layers are formed with respective specific patterns, a portion of the pattern features of existing patterns in both the current layer and the previous layer can be utilized to function as the overlay alignment mark, without additionally forming any dedicated/special overlay alignment mark. Thus, during both preparation and application of devices, a problem of failure of overlay error measurement in the art, which is potentially brought about due to lack of dedicated/special overlay alignment mark additionally provided is in turn avoided.

Moreover, in view of FIG. 2(a), for example as mentioned above, the first reference point $O_1$ functions as the symmetrical center of the two first solid features 101, and the second reference point $O_2$ also functions as the center of the mirror symmetry between the two second hollowed features 202. Furthermore, a coordinate value of the first reference point $O_1$ in the first direction x and a coordinate value of the second reference point $O_2$ in the first direction x are set such that a difference between these two coordinate values is expected to be a first constant. Moreover, in an ideal condition, the first constant is for example set to be zero, that is, the difference between the coordinate value of the first reference point $O_1$ in the first direction x and the coordinate value of the second reference point $O_2$ in the first direction x is the first constant having a preset value of zero (that is, the coordinate value of the first reference point $O_1$ in the first direction x and the coordinate value of the second reference point $O_2$ in the first direction x should be equal at this time).

With such a specific setting, a deviation between the coordinate value of the first reference point $O_1$ (which functions as the symmetrical center of the two first solid features 101) in the first direction x as practically measured and the coordinate value of the second reference point $O_2$ (which functions as the symmetrical center of the two second hollowed features 202) in the first direction x can be simply calculated (the difference between the coordinate value of the symmetrical center $O_1$ of the two first solid features 101 in the first direction x and the coordinate value of the symmetrical center $O_2$ of the two second hollowed features 202 in the first direction x is supposed/expected in the design to be the first constant, for example zero), on the basis of the single-pass SEM image which is acquired for both the first layer 1 and the second layer 2 which overlap at least partially with each other, so as to obtain a component of the overlay error between the current layer and the previous layer for example in the first direction x.

Figure 10:
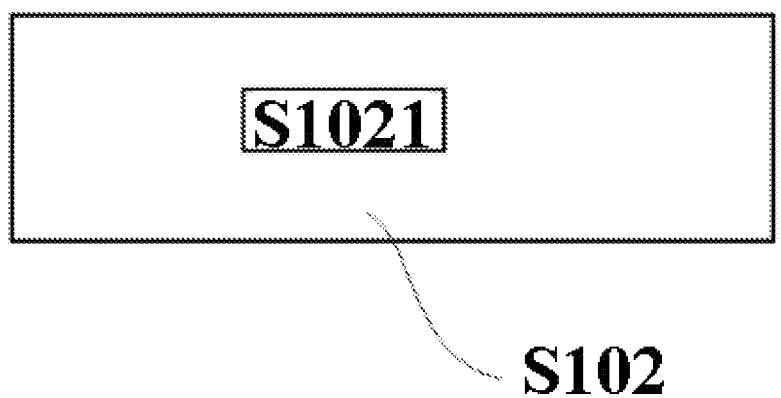
FIG. 10 shows a schematic block diagram of step S102 of the method for measuring overlay error as shown in FIG. 8, according to some embodiments of the present disclosure.

FIG. 10 shows a schematic block diagram of step S102 of the method for measuring overlay error as shown in FIG. 8, according to some embodiments of the present disclosure.

Specifically, by way of example as shown in FIG. 2(a), the coordinate value of the first reference point $O_1$ in the first direction x and the coordinate value of the second reference point $O_2$ in the first direction x are designed such that the difference therebetween is the first constant, and these two coordinates are equal to each other in a condition that the first constant is zero, as illustrated. In this condition, particularly for example as shown in FIG. 10, step S102, i.e., "measuring an overlay error between different layers of the wafer by measuring a deviation between portions of the overlay alignment mark which are located in the different layers of the wafer", for example, at least comprises S1021, i.e., obtaining a deviation between the first layer 1 and the second layer 2 in the first direction x, by subtracting the first constant from measurement of a deviation between the first pattern 10 and the second pattern 20 in the first direction x. Specifically, for example, by measuring the difference between the coordinate value of the first reference point $O_1$ in the first direction x and the coordinate value of the second reference point $O_2$ in the first direction x, the deviation between the first pattern 10 and the second pattern 20 in the first direction x can be measured.

In other words, by way of example, measurement of a deviation between the first pattern 10 and the second pattern 20 in the first direction x comprises: measuring a difference between the coordinate value of the first reference point $O_1$ in the first direction x and the coordinate value of the second reference point $O_2$ in the first direction x (the difference between the coordinate value of the symmetrical center $O_1$ of the two first solid features 101 in the first direction x and the coordinate value of the symmetrical center $O_2$ of the two second hollowed features 202 in the first direction x is supposed/expected in the design to be the first constant which is for example typically preset to be zero).

In view of FIG. 3(a) and FIG. 3(b), the first reference point $O_1$ and the second reference point $O_2$ are essentially respective projection points of two axes on the wafer both of which are respectively presented as the first axis and the second axis along the normal direction of the wafer in the sectional views of FIG. 3(a) and FIG. 3(b), and therefore these two reference points are each in the form of dot shape as illustrated in the top views of FIG. 2(a) and FIG. 2(b).

In view of FIG. 5, more specifically, by way of example, based on the above basic embodiment of overlay alignment mark and the first definition of the deviation between two layers in the first direction x, in some embodiments, "measuring a difference between the coordinate value of the first reference point $O_1$ in the first direction x and the coordinate value of the second reference point $O_2$ in the first direction x" comprises: obtaining the coordinate value of the first reference point in the first direction by measuring a half of a sum of mean values of coordinate values of respective two opposite side edges of the pair of solid features 101 in the first direction.

The coordinate value of the first reference point $O_1$ in the first direction x is obtained, by measuring a half of the sum of the mean values of the coordinate values, in the first direction x, of the two opposite side edges of the two first solid features 101 extending in the second direction y. In the specific implementation, the edge extraction and coordinate calculation of each first solid feature 101 can be implemented by the following way, i.e., in the single-pass SEM image, the centerline of each first solid sub-image in the second direction y is obtained, by performing edge extraction, based on edge extraction of the respective first solid sub-image which is imaged from each first solid feature 101 through the respective first hollowed feature 201 overlapping therewith; and then, a mean value of coordinate values of the centerlines of the two first solid sub-images extending in the second direction y, in the first direction can be calculated. Specific measurement and calculation are discussed in the embodiment with reference to FIG. 5, and will not be repeated here.

For example, in some embodiments, in a condition that the two second hollowed features 202 for example in view of FIG. 7(a) and FIG. 7(b) which do not overlap with the two first solid features 101 at all (i.e., the other pair of hollowed features 202 of the two pairs of hollowed feature 201, 202 being different from said respective pair of hollowed features 201) are designed such that a mean value between the coordinate values of respective geometric centers of the two second hollowed features 202 in the first direction is the same as the coordinate value of the second reference point in the first direction and thus the second reference point $O_2$ functions as the symmetrical center of the two second hollowed features 202, then, geometrical centers $O_{202}$, $O_{202}'$ are obtained/found by graphical fitting of each second hollowed feature 202, and then respective coordinate values of the geometrical centers $O_{202}$, $O_{202}'$ are acquired and in turn a mean value of the respective coordinate values of the geometrical centers $O_{202}$, $O_{202}'$ in the first direction x is calculated (for example, by performing graphical fitting for the respective second hollowed sub-images as imaged from each second hollowed feature 202 in the single-pass SEM image to be a pattern (for example, a circle pattern or an ellipse pattern), and extracting the coordinate values, in the first direction x, of the geometric centers of respective patterns as obtained by the graphical fitting of the two second hollowed sub-images and in turn calculating the mean value of these coordinate values of the geometric centers), the coordinate values of the second reference point $O_2$ in the first direction x is thus obtained. In a more typical embodiment, for example, the other pair of hollowed features 202 in the two pairs of hollowed feature 201, 202, which are different from the respective pair of hollowed features 201, are further designed such that the coordinate values of respective geometric centers thereof in the first direction are the same as each other.

In the specific implementation, the graphical fitting of each second hollowed feature 202 and in turn calculation of coordinates of geometric centers of the patterns as obtained by graphical fitting, are implemented, by performing graphical fitting of the respective second hollowed sub-image as imaged from each second hollowed feature 202 and extracting geometric centers of fitted patterns, in the single-pass SEM image. Specific measurement and calculation are discussed in the embodiments with reference to FIG. 5 and FIG. 6, and will not be repeated here.

In alternative or additional embodiments, by alternatively rotating the overlay alignment mark by 90 degrees, or by additionally setting another overlay alignment mark having the same patterns s the current overlay alignment mark but having its own orientation orthogonal to that of the current overlay alignment mark (for example, by providing the other overlay alignment mark having its patterns being the same as that of the current overlay alignment mark but its orientation being rotated 90 degrees as compared with that of the current overlay alignment mark, thus the first pattern 10 and the second pattern 20 of the other overlay alignment mark are specifically arranged such that, these patterns' respective arrangements in the first direction x and the second direction y respectively are just opposite to those of patterns in the overlay alignment mark as mentioned in the previous embodiments), then it also facilities that, based on the first definition as described above, the component of the overlay error between the current layer and the previous layer, for example in the second direction y, is obtained in relatively simplified step(s), without repeating details of such embodiments herein any more.

In addition, in order to obtain the coordinate value of the first reference point in the first direction, another setting is proposed in alternative embodiments of the present disclosure.

Based on the above basic embodiment of overlay alignment mark and the second definition of deviation between the two layers in the first direction x, in view of FIG. 7(*a*) and FIG. 7(*b*), specifically, the definition of the deviation in the first direction x in the overlay error between the first layer 1 and the second layer 2, for example as shown in FIG. 7(*a*), at least comprises: the deviation between the first pattern 10 and the second pattern 20 in the first direction x minus the first constant; and measurement of a deviation between the first pattern 10 and the second pattern 20 in the first direction x comprises: measuring ½ of a difference between distances between respective centerlines of the two solid features 101 parallel to the second direction y and the second reference point $O_2$ (i.e., |X1–X2|/2, as illustrated).

Furthermore, based on the second definition concerning the deviation between the two layers in the first direction x, and in view of FIG. 7, in the specific embodiments, a distance between respective centerline of each solid feature 101 of the pair of solid features parallel to the second direction y and the second reference point $O_2$ is obtained, by measuring an absolute value of a difference between a mean value of the coordinate values, in the first direction x, of respective two opposite side edges of each solid feature 101 extending in the second direction y, and the coordinate value of the second reference point $O_2$ in the first direction. Specific measurement and calculation are discussed in the embodiments as above, and will not be repeated here.

In alternative or additional embodiments, for example, under the same assumptions, by alternatively rotating the overlay alignment mark by 90 degrees, or by additionally setting another overlay alignment mark having the same patterns as the current overlay alignment mark but having its own orientation orthogonal to that of the current overlay alignment mark (for example, by providing the other overlay alignment mark having its patterns being the same as that of the current overlay alignment mark but its orientation being rotated 90 degrees as compared with that of the current overlay alignment mark, thus the first pattern 10 and the second pattern 20 of the other overlay alignment mark are specifically arranged such that, these patterns' respective arrangements in the first direction x and the second direction y respectively are just opposite to those of patterns in the overlay alignment mark as mentioned in the previous embodiments (for example, in the other overlay alignment mark, the direction y essentially functions as its first direction and the direction x functions as its second direction)), then it facilities that, a portion of graphic features of the existing pattern on both the previous layer and the current layer can be used as the overlay alignment mark, based on the first definition of the deviation in at least one direction in the overlay error as described above, without additionally forming a specialized/dedicated overlay alignment mark. Thus, the component of the overlay error between the current layer and the previous layer, for example in the second direction y, is obtained in relatively simplified step(s), without repeating details of such embodiments herein any more.

The method for measuring overlay error correspondingly comprises all the graphic features and corresponding advantages of the overlay alignment mark as above, and will not be repeated here.

As compared with relevant art, the embodiments of the present disclosure at least have the following superior technical effects:

An overlay alignment mark and a method for measuring overlay error are provided in the embodiments of the present disclosure. By providing the overlay alignment mark as described in the embodiments of the present disclosure, for the patterned wafer whose various layers are formed with respective specific patterns, a portion of the pattern features of existing patterns in both the current layer and the previous layer can be utilized to function as the overlay alignment mark. With the geometric shape of the patterns of the wafer and using tools provided by software, then measurement points are selected and calculation formula are set by an operator; and a sampling operation is in turn carried out and images are acquired by CD-SEM apparatus depending on a preset recipe, and a result of the overlay error is calculated and reported subsequently. Thereby, with the geometric pattern of a chip itself, rather than a dedicated/specialized overlay alignment mark which is specially provided, the CD-SEM apparatus is utilized to measure the overlay error by performing SEM imaging on the basis of the preset recipe and calculated the overlay error by using the calculation formula as preset, without additionally forming any dedicated/special overlay alignment mark. As such, during both preparation and application of devices, a problem of failure of overlay error measurement in the relevant art, which is potentially brought about due to lack of dedicated/special overlay alignment mark additionally provided is in turn avoided.

Moreover, by setting through-holes in the current layer or even at least one previous layer and solid features (such as linear sub-patterns and the like) in the previous layer which at least partially overlap with the through-holes respectively, the solid features can be observed through respective through-holes at least partially overlapping therewith, so as to avoid moving the SEM apparatus for many times during a layer-by-layer acquisition of SEM images by scanning thereby and an interference thus caused on measurement of the overlay error as applied by a displacement of the SEM apparatus relative to specific locations of the wafer to be scanned by electron beam emitted from the SEM apparatus, then it is not necessary to adjust energy of the electron beam of the SEM apparatus for many times; and the overlay error between different layers of the wafer, e.g., the overlay error between the current layer and the previous layer (and more specifically, for example, a component of the overlay error for example in the first direction x), can be calculated based on the single-pass SEM image by acquiring the SEM image only once, simplifying steps of measuring the overlay error.

The above are merely exemplary embodiments of the present disclosure, rather than intending to restrict the present application. And any modification, equivalent replacement, improvement, and the like which are made within the spirit and principle of the invention shall be comprised in the protection scope of the invention.

What is claimed is:

1. An overlay alignment mark located in a patterned wafer, the patterned wafer having a lower-layer pattern in a first layer thereof and an upper-layer pattern in a second layer thereof above the first layer, the overlay alignment mark comprising:

a first pattern, which is a portion of the lower-layer pattern and comprises a pair of solid features formed in the first layer; and a second pattern, which is a portion of the upper-layer pattern and comprises two pairs of hollowed features formed in the second layer, with two imaginary lines connecting between geometric centers of respective pairs in the two pairs of hollowed features extending in two mutually orthogonal directions, respectively, wherein an orthographic projection of the pair of solid features on the wafer at least partially overlaps with an orthographic projection of a respective pair of hollowed features on the wafer.

2. The overlay alignment mark according to claim 1, wherein the pair of solid features are designed to be in the form of two solid patterns having strip-shaped sections in the first layer respectively, both of which not only have central symmetry, to each other, about a first reference point located therebetween in the first layer, but also have mirror symmetry to each other with respect to the first reference point, wherein the two pairs of hollowed feature are designed to be in the form of two pairs of through-holes having rectangular sections in the second layer respectively, with the two imaginary lines connecting between geometric centers of respective pairs in the two pairs of through-holes extending in the two mutually orthogonal directions respectively, wherein the pair of solid features are at least partially observable through one pair of through-holes, which functions as the respective pair of hollowed features and have its respective imaginary line connecting between geometric centers thereof extending in a first direction of the two mutually orthogonal directions, and the other pair of through-holes not only have central symmetry about a second reference point in the second layer but also have mirror symmetry to each other with respect to the second reference point, and wherein respective two opposite side edges of the strip-shaped sections of the pair of solid features extend in a second direction, perpendicular to the first direction, of the two mutually orthogonal directions and are at least partially exposed from the respective pair of hollowed features.

3. The overlay alignment mark according to claim 2, wherein the upper-layer pattern of the wafer comprises a plurality of through-holes arranged in an array, and the two pairs of hollowed features comprise: a first pair of through-holes arranged in one of both a row direction and a column direction of the array, and a second pair of through-holes arranged in the other of both the row direction and the column direction of the array, in the plurality of through-holes; and wherein respective two opposite side edges of the strip-shaped sections of the pair of solid features extending in one of the row direction and the column direction are at least partially exposed from a respective pair of the first pair of through-holes and the second pair of through-holes.

4. The overlay alignment mark according to claim 2, wherein a coordinate value of the first reference point in the first direction and a coordinate value of the second reference point in the first direction are set such that a difference between these two coordinate values is a first constant.

5. The overlay alignment mark according to claim 4, wherein the first constant is zero.

6. The overlay alignment mark according to claim 4, wherein an overlay error between different layers of the wafer is an overlay error between the first layer and the second layer, at least comprising:

a deviation between the first layer and the second layer in the first direction, which is defined by subtracting the first constant from a deviation between the first pattern and the second pattern in the first direction.

7. The overlay alignment mark according to claim 6, wherein the deviation between the first pattern and the second pattern in the first direction is defined as a difference between the coordinate value of the first reference point in the first direction and the coordinate value of the second reference point in the first direction.

8. The overlay alignment mark according to claim 7, wherein the coordinate value of the first reference point in the first direction is defined as a half of a sum of mean values of coordinate values of respective two opposite side edges of the pair of solid features in the first direction.

9. The overlay alignment mark according to claim 6, wherein the deviation between the first pattern and the second pattern in the first direction is defined as ½ of a difference between distances between respective centerlines of the pair of solid features parallel to the second direction and the second reference point.

10. The overlay alignment mark according to claim 9, wherein, a distance between respective centerline of each solid feature of the pair of solid features parallel to the second direction and the second reference point, is defined as:

an absolute value of a difference between a mean value of the coordinate values of respective two opposite side edges of each solid feature extending in the second direction, in the first direction and the coordinate value of the second reference point in the first direction.

11. The overlay alignment mark according to claim 7, wherein the other pair of hollowed features which are different from the respective pair of hollowed features, are designed such that a mean value between coordinate values of respective geometric centers thereof in the first direction is the same as the coordinate value of the second reference point in the first direction.

12. The overlay alignment mark according to claim 11, wherein the other pair of hollowed features which are different from the respective pair of hollowed features, are designed such that the coordinate values of respective geometric centers thereof in the first direction are the same as each other.

13. The overlay alignment mark according to claim 11, wherein the coordinate value of the second reference point in the first direction is defined as a mean value of coordinate values, in the first direction, of geometric centers of circle patterns or ellipse patterns obtained by fitting from the other pair of hollowed features.

\* \* \* \* \*